United States Patent
Forbes

(10) Patent No.: US 8,962,447 B2
(45) Date of Patent: Feb. 24, 2015

(54) BONDED STRAINED SEMICONDUCTOR WITH A DESIRED SURFACE ORIENTATION AND CONDUCTANCE DIRECTION

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 177 days.

(21) Appl. No.: 11/498,586

(22) Filed: Aug. 3, 2006

(65) Prior Publication Data
US 2008/0029832 A1    Feb. 7, 2008

(51) Int. Cl.
| | | |
|---|---|---|
| H01L 21/30 | (2006.01) | |
| H01L 21/46 | (2006.01) | |
| H01L 21/8238 | (2006.01) | |
| H01L 29/10 | (2006.01) | |
| H01L 29/66 | (2006.01) | |
| H01L 29/78 | (2006.01) | |

(52) U.S. Cl.
CPC .... *H01L 21/823807* (2013.01); *H01L 29/1037* (2013.01); *H01L 29/66651* (2013.01); *H01L 29/7843* (2013.01); *H01L 29/7849* (2013.01)
USPC .................................. 438/455; 257/E21.633

(58) Field of Classification Search
USPC .................. 438/150, 938, 455–459
See application file for complete search history.

(56) References Cited

U.S. PATENT DOCUMENTS

| | | |
|---|---|---|
| 5,234,535 A | 8/1993 | Beyer et al. |
| 5,441,591 A | 8/1995 | Imthurn et al. |
| 5,461,243 A | 10/1995 | Ek et al. |
| 5,759,898 A | 6/1998 | Ek et al. |
| 5,877,070 A | 3/1999 | Goesele et al. |
| 5,879,996 A | 3/1999 | Forbes |
| 5,963,817 A | 10/1999 | Chu et al. |
| 6,049,106 A | 4/2000 | Forbes |
| 6,228,694 B1 | 5/2001 | Doyle et al. |
| 6,245,615 B1 | 6/2001 | Noble et al. |
| 6,251,751 B1 | 6/2001 | Chu et al. |
| 6,309,950 B1 | 10/2001 | Forbes |
| 6,319,784 B1 | 11/2001 | Yu et al. |
| 6,328,796 B1 | 12/2001 | Kub et al. |
| 6,423,613 B1 | 7/2002 | Geusic |
| 6,455,397 B1 | 9/2002 | Belford |
| 6,486,008 B1 | 11/2002 | Lee |
| 6,514,836 B2 | 2/2003 | Belford |
| 6,515,335 B1 | 2/2003 | Christiansen et al. |

(Continued)

FOREIGN PATENT DOCUMENTS

JP    54-155770 A    12/1979

OTHER PUBLICATIONS

"Cornell Demonstrates a Universal Substrate", *Compound Semiconductor*, 3(2), (Mar./Apr. 1997),27-29.

(Continued)

*Primary Examiner* — Daniel Luke
(74) *Attorney, Agent, or Firm* — Schwegman Lundberg & Woessner, P.A.

(57) ABSTRACT

According to various method embodiments, a semiconductor layer is oriented to a substrate. The semiconductor layer has a surface orientation and is oriented to the substrate to provide a desired direction of conductance for the surface orientation. The oriented semiconductor layer is bonded to the substrate to strain the semiconductor layer. Various embodiments provide a tensile strain, and various embodiments provide a compressive strain. Other aspects and embodiments are provided herein.

57 Claims, 14 Drawing Sheets

(56) References Cited

U.S. PATENT DOCUMENTS

| | | | |
|---|---|---|---|
| 6,593,625 | B2 | 7/2003 | Christiansen et al. |
| 6,603,156 | B2 | 8/2003 | Rim |
| 6,630,713 | B2 | 10/2003 | Geusic |
| 6,649,492 | B2 | 11/2003 | Chu et al. |
| 6,689,671 | B1 | 2/2004 | Yu et al. |
| 6,703,648 | B1 | 3/2004 | Xiang et al. |
| 6,717,216 | B1 | 4/2004 | Doris et al. |
| 6,734,940 | B2 | 5/2004 | Hirabayashi |
| 6,740,913 | B2 | 5/2004 | Doyle et al. |
| 6,767,802 | B1 | 7/2004 | Maa et al. |
| 6,812,116 | B2 | 11/2004 | Huang et al. |
| 6,828,214 | B2 | 12/2004 | Notsu et al. |
| 6,881,650 | B2 | 4/2005 | Lee et al. |
| 6,900,521 | B2 | 5/2005 | Forbes et al. |
| 6,902,962 | B2 * | 6/2005 | Yeo et al. ............ 438/150 |
| 6,911,379 | B2 | 6/2005 | Yeo et al. |
| 6,940,089 | B2 | 9/2005 | Cheng et al. |
| 6,960,821 | B2 | 11/2005 | Noble et al. |
| 6,963,078 | B2 | 11/2005 | Chu |
| 6,987,037 | B2 | 1/2006 | Forbes |
| 6,987,039 | B2 | 1/2006 | Chatterjee |
| 7,041,575 | B2 | 5/2006 | Forbes |
| 7,115,480 | B2 | 10/2006 | Forbes |
| 7,238,589 | B2 | 7/2007 | Cohen et al. |
| 7,544,584 | B2 | 6/2009 | Forbes |
| 8,124,977 | B2 | 2/2012 | Forbes |
| 8,227,309 | B2 | 7/2012 | Forbes et al. |
| 8,435,850 | B2 | 5/2013 | Forbes et al. |
| 2002/0001965 | A1 | 1/2002 | Forbes |
| 2002/0185686 | A1 | 12/2002 | Christiansen et al. |
| 2003/0013323 | A1 | 1/2003 | Hammond et al. |
| 2003/0201468 | A1 | 10/2003 | Christiansen et al. |
| 2004/0173798 | A1 | 9/2004 | Forbes |
| 2004/0217352 | A1 | 11/2004 | Forbes |
| 2004/0217391 | A1 | 11/2004 | Forbes |
| 2004/0221792 | A1 | 11/2004 | Forbes |
| 2004/0224480 | A1 | 11/2004 | Forbes |
| 2004/0232487 | A1 | 11/2004 | Forbes |
| 2004/0232488 | A1 | 11/2004 | Forbes |
| 2005/0020094 | A1 | 1/2005 | Forbes et al. |
| 2005/0023529 | A1 | 2/2005 | Forbes |
| 2005/0023612 | A1 | 2/2005 | Forbes |
| 2005/0023616 | A1 | 2/2005 | Forbes |
| 2005/0029619 | A1 | 2/2005 | Forbes |
| 2005/0032296 | A1 * | 2/2005 | Forbes ............ 438/232 |
| 2005/0087842 | A1 | 4/2005 | Forbes |
| 2005/0118754 | A1 * | 6/2005 | Henley ............ 438/197 |
| 2005/0156210 | A1 | 7/2005 | Currie et al. |
| 2005/0156230 | A1 | 7/2005 | Forbes et al. |
| 2005/0184345 | A1 | 8/2005 | Lin et al. |
| 2005/0247972 | A1 | 11/2005 | Forbes |
| 2005/0259475 | A1 | 11/2005 | Forbes |
| 2005/0276117 | A1 | 12/2005 | Forbes |
| 2006/0024917 | A1 * | 2/2006 | Henley et al. ............ 438/455 |
| 2006/0049460 | A1 * | 3/2006 | Chen et al. ............ 257/347 |
| 2006/0094175 | A1 | 5/2006 | Cohen et al. |
| 2006/0118915 | A1 | 6/2006 | Hwang |
| 2006/0292822 | A1 | 12/2006 | Xie |
| 2007/0087514 | A1 | 4/2007 | Hamamoto |
| 2007/0096170 | A1 | 5/2007 | Chidambarrao et al. |
| 2007/0187683 | A1 | 8/2007 | Forbes |
| 2009/0218566 | A1 | 9/2009 | Forbes |
| 2012/0122287 | A1 | 5/2012 | Forbes |
| 2012/0289016 | A1 | 11/2012 | Forbes |

OTHER PUBLICATIONS

Abe, T, "Silicon Wafer-Bonding Process Technology for SOI Structures", *Extended Abstracts of the 22nd (1990 International) Conference on Solid State Devices and Materials*, (1990),853-856.

Aberg, I, et al., "Electron and hole mobility enhancements in sub-10 nm-thick strained silicon directly on insulator fabricated by a bond and etch-back technique", *2004 Symposium on VLSI Technology Digest of Technical Papers*, (Jun. 2004),52-53.

Aberg, I. , et al., "High electron and hole mobility enhancements in thin-body strained Si/strained SiGe/strained Si heterostructures on insulator", *IEEE International Electron Devices Meeting, 2004. IEDM Technical Digest.*, (Dec. 2004),173-176.

Ang, Kah W., "Enhanced performance in 50 nm N-MOSFETs with silicon-carbon source/drain regions", *IEEE International Electron Devices Meeting, 2004. IEDM Technical Digest.*, (Dec. 2004),1069-1071.

Belford, Rona E., et al., "Performance-Augmented CMOS Using Back-End Uniaxial Strain", *IEEE 60th DRC. Conference Digest Device Research Conference, 2002*, (Jun. 24-26, 2002),41-42.

Biever, Celeste , "Secret of 'strained silicon'revealed: behind closed doors, Intel has perfected a novel way to improve chip performance.", *New Scientist*, 180(i2426-2428), (Dec. 20, 2003),27.

Brown, Chappell , "Bonding twist hints at universal substrate", *EETimes*, (1997),2 pages.

Bruel, M , "Smart-Cut: a new silicon on insulator material technology based on hydrogen implantation and wafer bonding", *Japanese Journal of Applied Physics, Part 1 (Regualar Papers, Short Notes & Review Papers)*, 36(3B), (1997),1636-1641.

Cai, J. , "Performance Comparison and Channel Length Scaling of Strained Si FETs on SiGe-On-Insulator (SGOI)", *IEEE International Electron Devices Meeting, 2004, IEDM Technical Digest.*, (Dec. 2004),165-168.

Cheng, Z. , et al., "Fully depleted strained-SOI n- and p-MOSFETs on bonded SOGI substrates and study of the SiGe/BOX interface", *IEEE Electron Device Letters*, 25(3), (Mar. 2004),147-49.

Chilton, B T., et al., "Solid phase epitaxial regrowth of stained Si(1-x)Ge(x)/Si strained layer structures amorphized by ion implantation", *Applied Physics Letters*, 54(1), (Jan. 2, 1989),42-44.

Chleirigh, C. N., "Mobility and Sub-threshold Characteristics in High-Mobility Dual-Channel Strained Si/Strained SiGe P-MOSFETs", *IEEE Device Research Conference*, Santa Barbara, CA Jun. 20-22, 2005,(2005),203-204.

Clifton, P A., et al., "A process for strained silicon n-channel HMOSFETs", *ESSDERC'96. Proceedings of the 26th European Solid State Device Research Conference*, (Sep. 1996),519-22.

Fischetti, M V., et al., "Band structure, deformation potentials, and carrier mobility in strained Si, Ge, and SiGe alloys", *Journal of Applied Physics*, 80(4), (Aug. 15, 1996),2234-2252.

Forbes, L. , "Localized Compressive Strained Semiconductor", U.S. Appl. No. 11/346,335, filed Feb. 16, 2006.

Forbes, K Y., "Non-Volatile Memory Device with Tensile Strained Silicon Layer", U.S. Appl. No. 11/260,339, 26 pgs.

Fournel, F , et al., "Ultra High Precision of the Tilt/Twist Misorientation Angles in Silicon/Silicon Direct Wafer Bonding", *Abstract—Electronic Materials Conference*, (Jun. 2002),9.

Ghani, T. , "A 90nm High Volume Manufacturing Logic Technology Featuring Novel 45nm Gate Length Strained Silicon CMOS Transistors", *Technical Digest IEEE International Electron Devices Meeting*, (Dec. 2003),978-980.

Goto, K. , "Technology Booster using Strain-Enhancing Laminated SiN (SELS) for 65nm Node Hp MPUs", *IEDM Technical Digest. IEEE International Electron Devices Meeting*, (Dec. 2004),209-212.

Harendt, Christine , "Silicon on Insulator Material by Wafer Bonding", *Journal of Electronic Materials*, 20(3), (Mar. 1991),267-77.

Irie, H. , et al., "In-plane mobility anisotropy and universality under uni-axial strains in n and p-MOS inversion layers on (100), [110], and (111) Si", *IEEE International Electron Devices Meeting, 2004. IEDM Technical Digest.*, (Dec. 2004),225-228.

Kal, S. , et al., "Strained Silicon—SiGe Devices Using Germanium Implantation", *IETE Journal of Research*, 43 (2-3), (Mar. 1997),185-192.

Kawasaki, Hirohisa , "Impact of Parasitic Resistance and Silicon Layer Thickness Scaling for Strained-Silicon MOSFETs on Relaxed Si1-xGex virtual substrate", *IEEE International Electron Devices Meeting, 2004. IEDM Technical Digest.*, (Dec. 2004),169-172.

Komoda, T. , "Mobility Improvement for 45nm Node by Combination of Optimized Stress Control and Channel Orientation Design", *IEEE International Electron Devices Meeting, 2004. IEDM Technical Digest.*, (Dec. 2004),217-220.

(56) References Cited

OTHER PUBLICATIONS

Lu, D, , "Bonding Silicon Wafers by Use of Electrostatic Fields Followed by Rapid Thermal Heating", *Materials Letters*, 4(11), (Oct. 1986),461-464.
Maikap, S. , "Package-strain-enhanced device and circuit performance", *IEEE International Electron Devices Meeting, 2004. IEDM Technical Digest.*, (Dec. 2004),233-236.
Meyerson, B S., "SiGe-Channel Heterojunction p-MOSFET's", *IEEE Transactions on Electron Devices*, 41(1), Authors: Verdonckt-Vandebroek, S.; Crabbe, E.F.; Meyerson, B.S.; Harame, D.L.; Restle, P.J.; Stork, J.M.C.; Johnson, J.B.,(Jan. 1994),90-101.
Mizuno, T , et al., "Advanced SOI-MOSFETs with Strained-Si Channel for High Speed CMOS Electron/Hole Mobility Enhancement", *2000 Symposium on VLSI Technology. Digest of Technical Papers*, (2000),210-211.
Nayak, D. K., "High performance GeSi quantum-well PMOS on SIMOX", *International Electron Devices Meeting 1992. Technical Digest*, (1992),777-780.
Numata, Toshinori , "Performance Enhancement of Partially- and Fully-Depleted Strained-SOI MOSFETs and Characterization of Strained-Si Device Parameters", *IEEE International Electron Devices Meeting, 2004. IEDM Technical Digest.*, (Dec. 2004),177-180.
O'Neill, A G., et al., "High speed deep sub-micron MOSFET using high mobility strained silicon channel", *ESSDERC '95. Proceedings of the 25th European Solid State Device Research Conference*, (Sep. 1995),109-12.
Omi, Hiroo , et al., "Semiconductor Surface with Strain Control", http://www.brl.ntt.co.jp/J/kouhou/katsudou/report00/E/report04_e.html.
Paine, D. C., et al., "The Growth of Strained Si]-xGex Alloys on (100) Silicon Using Solid Phase Epitaxy", *Journal of Materials Research*, 5(5), (May 1990),1023-1031.
People, R. , "Calculation of critical layer thickness versus lattice mismatch for GexSi1-x/Si strained-layer heterostructures", *Applied Physics Letters*, 47(3), (Aug. 1, 1985),322-324.
Pidin, S. , "A Novel Strain Enhanced CMOS Architecture Using Selectively Deposited High Tensile and High Compressive Silicon Nitride Films", *IEEE International Electron Devices Meeting, 2004. IEDM Technical Digest.*, (Dec. 2004),213-216.
Rim, Kern , et al., "Fabrication and analysis of deep submicron strained-Si n-MOSFET's", *IEEE Transactions on Electron Devices*, 47(7), (Jul. 2000),1406-1415.
Rim, Kern , et al., "Strained Si NMOSFETs for High Performance CMOS Technology", *2001 Symposium on VLSI Technology. Digest of Technical Papers*, (2001),59-60.
Rim, Kern , et al., "Transconductance enhancement in deep submicron strained Si n-MOSFETs", *International Electron Devices Meeting 1998. Technical Digest*, (1998),707-710.
Subbanna, Seshadri , "High-Performance Silicon-Germanium Technology", *63rd Device Research Conference Digest, 2005. DRC '05.*, (2005),195-196.
Sugiyama, N , et al., "Formation of strained-silicon layer on thin relaxed-SiGe/SiO/sub 2//Si structure using SIMOX technology", *Thin Solid Films*, 369(1-2),(Jul. 2000),199-202.
Sung, Chun-Yung , et al., "High Performance CMOS Bulk Technology using Direct Silicon Bond (DSB) Mixed Crystal Orientation Substrates", *IEDM Technical Digest, IEEE International Volume*, (Dec. 5, 2005),225-228.
Takagi, Shin-Ichi , "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002),37-40.
Thompson, S. E., "Key Differences for Process-induced Uniaxial vs. Substrate-induced Biaxial Stressed Si and Ge Channel MOSFETs", *IEEE International Electron Devices Meeting, 2004. IEDM Technical Digest*, (Dec. 2004),221-224.
Uchida, Ken , "Experimental Study of Biaxial and Uniaxial Strain Effects on Carrier Mobility in Bulk and Ultrathin-body SOI MOSFETs", *IEEE International Electron Devices Meeting, 2004. IEDM Technical Digest.*, (Dec. 2004),229-232.
Welser, J , "Strain dependence of the performance enhancement in strained-Si n-MOSFETs", *IEEE International Electron Devices Meeting 1994. Technical Digest*, (Dec. 11-14, 1994),373-376.
Yin, Haizhou , et al., "Fully-depleted strained-Si on insulator NMOSFETs without relaxed SiGe buffers", *IEEE International Electron Devices Meeting, 2003. IEDM '03 Technical Digest.*, (Dec. 2003),3.2.1-3.2.4.
Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996),31.
Zhu, Z H., et al., "Wafer bonding technology and its applications in optoelectronic devices and materials", *IEEE Journal of Selected Topics in Quantum Electronics*, (Jun. 1997),927-936.
Wolf, S., et al., "", Silicon Processing for the VLSI Era: vol. 1, Lattice Press: Sunset Beach, CA, (2000), 268-269.

\* cited by examiner

BONDED STRAINED SEMICONDUCTOR WITH A DESIRED SURFACE ORIENTATION AND CONDUCTANCE DIRECTION

TECHNICAL FIELD

This disclosure relates generally to semiconductor structures, and more particularly, to strained semiconductor, devices and systems, and methods of forming the strained semiconductor, devices and systems.

BACKGROUND

The semiconductor industry continues to strive for improvements in the speed and performance of semiconductor devices. Strained silicon technology has been shown to enhance carrier mobility in both n-channel and p-channel devices, and thus has been of interest to the semiconductor industry as a means to improve device speed and performance. Currently, strained silicon layers are used to increase electron mobility in n-channel CMOS transistors. There has been research and development activity to increase the hole mobility of p-channel CMOS transistors using strained silicon germanium layers on silicon.

FIG. 1A illustrates a known device for improved hole mobility with an n-type silicon substrate 101, a silicon germanium layer 102, a silicon capping layer 103, a gate oxide 104, a gate 105, and N+ source/drain regions 106 and 107. FIG. 1B illustrates a band structure for the device of FIG. 1A, and indicates that some carriers or holes are at the silicon-oxide interface and some are confined in the silicon germanium layer. Both the silicon germanium and the silicon capping layers will be strained if they are thin. Alternatively, the silicon germanium layer may be graded to a relaxed or unstrained layer resulting in more stress in the silicon cap layer. The crystalline silicon layer is strained by a lattice mismatch between the silicon germanium layer and the crystalline silicon layer.

More recently, strained silicon layers have been fabricated on thicker relaxed silicon germanium layers to improve the mobility of electrons in NMOS transistors. Structures with strained silicon on silicon germanium on insulators have been described as well as structures with strained silicon over a localized oxide insulator region. These structures yield high mobility and high performance transistors on a low capacitance insulating substrate.

Wafer bending has been used to investigate the effect of strain on mobility and distinguish between the effects of biaxial stress and uniaxial stress. Bonding a semiconductor onto bowed or bent substrates has been disclosed to introduce strain in the semiconductor. Stress can also be introduced by wafer bonding. Packaging can introduce mechanical stress by bending. Compressively-strained semiconductor layers have been bonded to a substrate.

FIGS. 2-4 illustrate some known techniques to strain channels and improve carrier mobilities in CMOS devices. FIG. 2 illustrates a known device design to improve electron mobility in NMOS transistors using a tensile strained silicon layer on silicon germanium. As illustrated, a graded silicon germanium layer 208 is formed on a p-type silicon substrate 209 to provide a relaxed silicon germanium region 210, upon which a strained silicon layer 211 is grown. The transistor channel is formed in the strained silicon layer 211. There is a large mismatch in the cell structure between the silicon and silicon germanium layers, which biaxially strains the silicon layer. As illustrated in FIG. 3, uniaxial compressive stress can be introduced in a channel 312 of a PMOS transistor to improve hole mobility using silicon germanium source/drain regions 313 in trenches adjacent to the PMOS transistor. Large improvements in hole mobility, up to 50%, have been made in PMOS devices in silicon technology using strained silicon germanium source/drain regions to compressively strain the transistor channel. Silicon-carbide source/drain regions in trenches adjacent to an NMOS transistor can introduce tensile stress and improve electron mobility. FIG. 4 illustrates a known device design to improve mobility for both NMOS and PMOS transistors using silicon nitride capping layers 414. These silicon nitride capping layers can be formed to introduce tensile stress for NMOS transistors and can be formed to introduce compressive stress for PMOS transistors.

Another proposal to improve device speed and performance involves higher mobility surfaces. For example, it has been proposed to bond unstrained (110) layers of silicon onto (100) surface substrates to improve hole mobility in unstrained channel regions of p-channel MOSFETs, and to amorphize the regions in which to fabricate n-channel transistors and recrystallize the (100) silicon seeded by the underlying (100) substrate to provide the unstrained channel region of n-channel MOSFETs with the high channel mobility characteristic of the (100) surface.

DETAILED DESCRIPTION

Figure 1A:
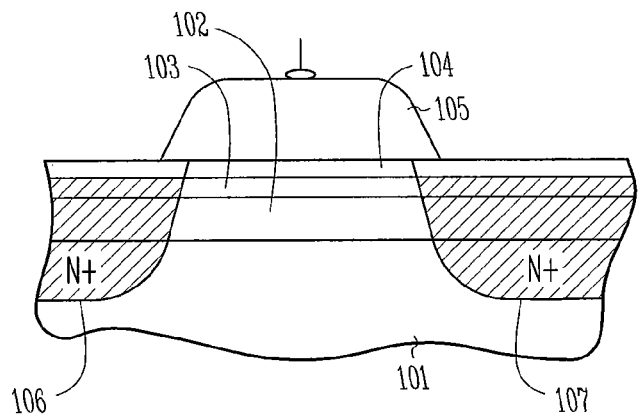
FIG. 1A illustrates a known device for improved hole mobility.
Figure 1B:
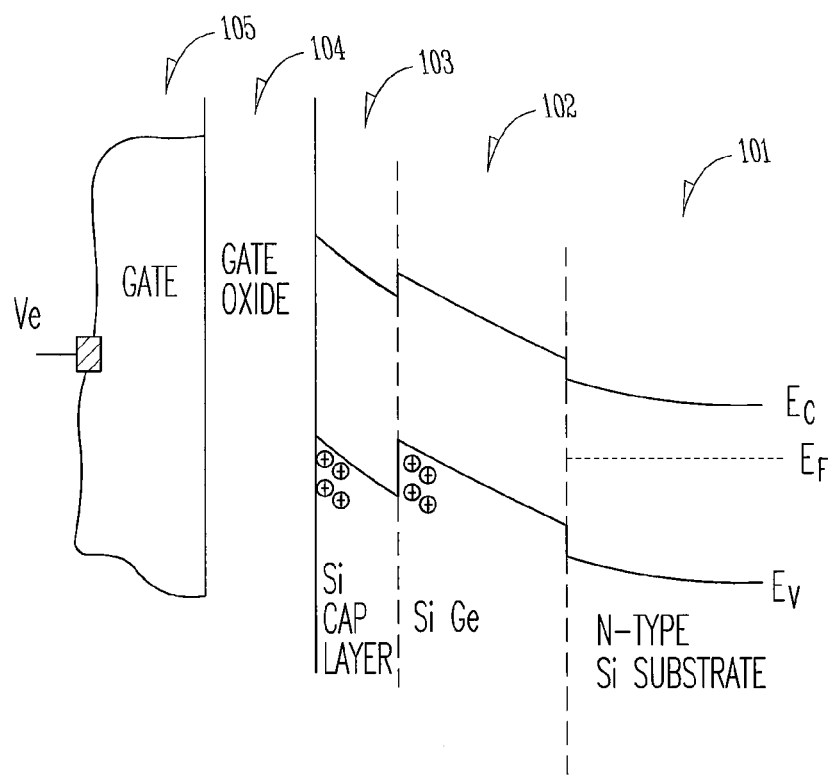
FIG. 1B illustrates a band structure for the device of FIG. 1A.
Figure 2:
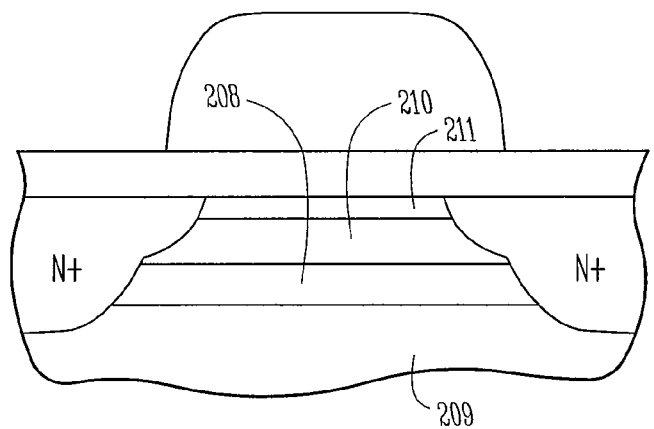
FIG. 2 illustrates a known device design to improve electron mobility in NMOS transistors using a tensile strained silicon layer on silicon germanium.
Figure 3:
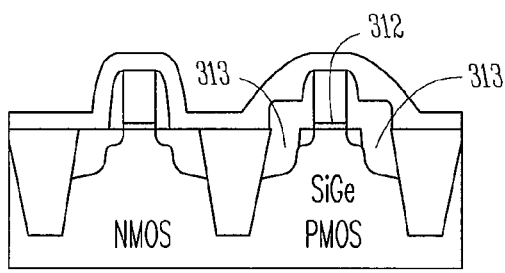
FIG. 3 illustrates a known device design to provide uniaxial compressive stress in a channel of a PMOS transistor using silicon germanium source/drain regions in trenches adjacent to the PMOS transistor.
Figure 4:
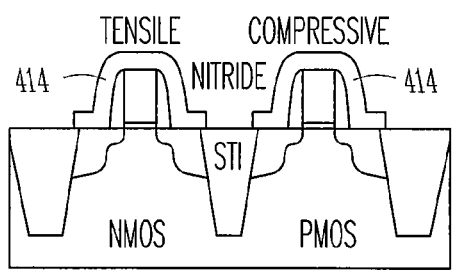
FIG. 4 illustrates a known device design to improve mobility for both NMOS and PMOS transistors using silicon nitride capping layers.

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilized and structural, logical, and electrical changes may be made without departing from the scope of the present subject matter. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

According to various method embodiments, a semiconductor layer is oriented to a substrate. The semiconductor layer has a surface orientation and is oriented to the substrate to provide a desired direction of conductance for the surface orientation. The oriented semiconductor layer is bonded to the substrate to strain the semiconductor layer.

According to various embodiments for forming a transistor, a strained semiconductor layer is formed on a substrate, which includes orienting a semiconductor layer to a substrate and bonding the oriented semiconductor layer to the substrate to strain the semiconductor layer. The semiconductor layer has a surface orientation and is oriented to provide a desired direction of conductance for the surface orientation. A gate insulator is formed on the strained semiconductor layer, a gate is formed on the gate insulator, and first and second diffusion regions define a channel beneath the gate insulator between the first and second diffusion regions.

According to various embodiments for forming a CMOS device, a strained semiconductor layer is formed on a substrate. A first semiconductor layer and a second semiconductor layer are oriented to a substrate. The first semiconductor layer has a first surface orientation and is oriented to provide a first desired direction of conductance for the first surface orientation to promote electron mobility. The second semiconductor layer has a second surface orientation and is oriented to provide a second desired direction of conductance for the second surface orientation to promote hole mobility. The first and second oriented semiconductor layers are bonded to the substrate to strain the semiconductor layer. An n-channel transistor is formed using the first semiconductor layer and a p-channel transistor is formed using the second semiconductor layer.

Various structure embodiments include a substrate and a crystalline semiconductor layer bonded to the substrate. The semiconductor layer has a surface orientation and a desired channel conductance direction for the surface orientation. The crystalline semiconductor layer has a local strained region. The structure further includes a gate oxide over the local strained region, a gate over the gate oxide, and first and second source/drain regions to provide a channel region with the desired channel conductance direction within in the local strained region.

For example, strips of silicon of different surface orientations and strip directions can be bonded onto silicon substrates of various surface orientations. The strip direction corresponds to a desired direction of conduction. In transistor embodiments, the desired direction of conduction for the strained silicon is the channel direction. The strips of silicon can be locally strained, and can either be tensile strained during the bonding process to improve the electron mobility and/or can be compressive strained during the bonding process to improve the hole mobility. The improved carrier mobility improves CMOS transistor performance. The carrier wafer or substrate can be a silicon wafer of any surface orientation, such as the common (100), (110) or (111) silicon substrates.

Tensile Strain Embodiments

FIGS. 5A-5I illustrate an embodiment where a semiconductor layer is bonded to tensile strain the semiconductor layer, such as is provided in U.S. Published Patent Application 20040224480, filed May 7, 2003 and entitled "Micromechanical Strained Semiconductor By Wafer Bonding." U.S. 20040224480 is incorporated by reference herein in its entirety.

Figure 5A:
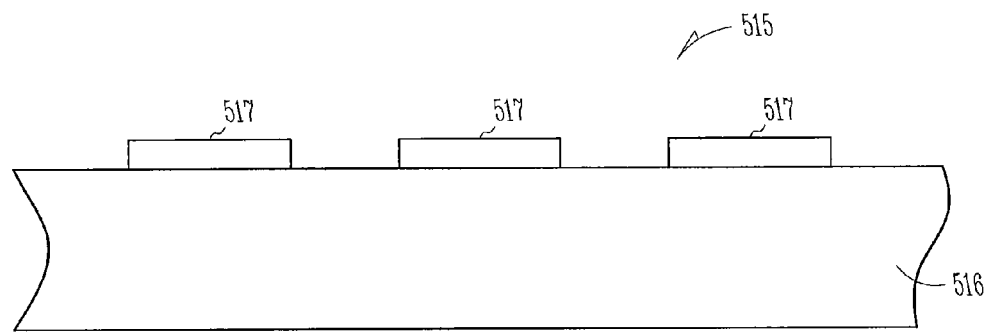
FIGS. 5A-5I illustrate an embodiment where a semiconductor layer is bonded to tensile strain the semiconductor layer.
Figure 5B:
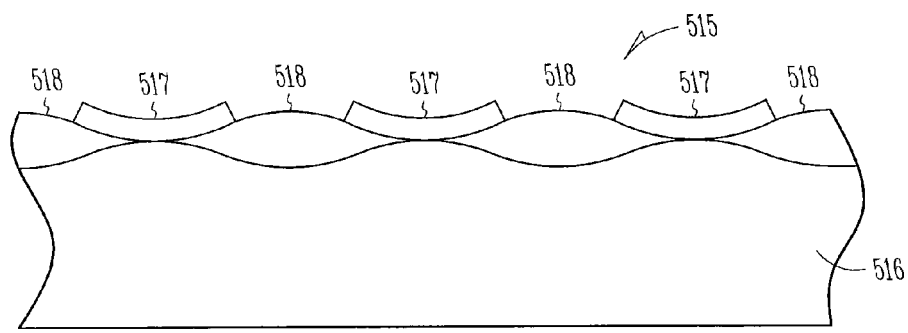
Figure 5C:
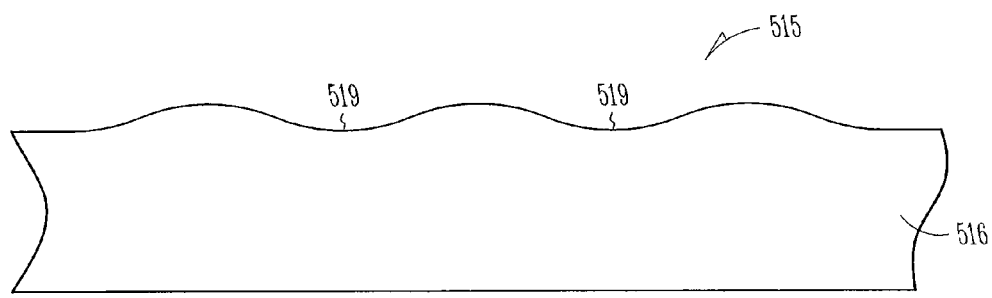

FIGS. 5A-5C illustrate a process for forming recesses in a substrate using a LOCal Oxidation of Silicon (LOCOS) process according to various embodiments. The LOCOS process is useful to form recesses in silicon substrates, and one of ordinary skill in the art will understand, upon reading and comprehending this disclosure, that other methods to form recesses in substrates can be used for silicon and other substrates.

FIG. 5A illustrates a semiconductor structure 515 toward the beginning of a LOCOS process. The semiconductor structure 515 includes a silicon substrate 516. A layer of silicon nitride 517 is deposited, such as by Chemical Vapor Deposition (CVD) and the like, on the silicon substrate and is etched to expose portions of the silicon substrate for subsequent selective oxidation. One of ordinary skill in the art will understand, upon reading and comprehending this disclosure, that the pattern of the silicon nitride affects the pattern and characteristics of the recesses and thus of the strained semiconductor film.

FIG. 5B illustrates the semiconductor structure 515 after the silicon substrate 516 has been oxidized. In various embodiments, the oxide 518 is thermally grown by means of wet oxidation. The oxide grows where there is no masking nitride. At the edges of the nitride, some oxidant diffuses laterally to grow under the nitride edges. This lateral growth has the shape of a slowly tapering oxide wedge and is commonly referred to as a "bird's beak."

FIG. 5C illustrates the semiconductor structure 516 after the oxide has been removed. Recesses 519 remain where the oxidation occurred. Because of the formation of the recesses 519, the substrate 516, also referred to as a first wafer, can be referred to as a dimpled substrate as, in various embodiments, the substrate has a dimpled appearance. As provided below, a second wafer, or membrane, is bonded to the substrate such that portions of the second wafer are strained in the recesses of the substrate.

One benefit of the LOCOS process is that it is a common economical semiconductor fabrication process. Another benefit of the LOCOS process is the tapered bird's beak, which allows for controlled strain in the film. One of ordinary skill in the art will understand, upon reading and comprehending this disclosure, that the slowly tapering shape of the bird's beak is useful to controllably induce strain in ultra-thin semiconductor films. However, the tapered bird's beak shape is not required to practice the present subject matter. One of ordinary skill in the art will understand, upon reading and comprehending this disclosure, that other means for creating a recess or void in the substrate can be used. For example, a grinding process can be used to create a recess or a trench can be otherwise formed in the substrate.

FIGS. 5D-5H illustrate a method to form a strained semiconductor membrane using a bond cut process to bond a membrane to a substrate with recesses, according to various embodiments. The bond cut process involves bonding together two substrates, or wafers, and breaking off a section of at least one of the two substrate after the substrates have been bonded together. The substrate is also referred to herein in various embodiments as a first wafer or dimpled substrate, and the membrane is also referred to herein in various embodiments as a second wafer.

Figure 5D:
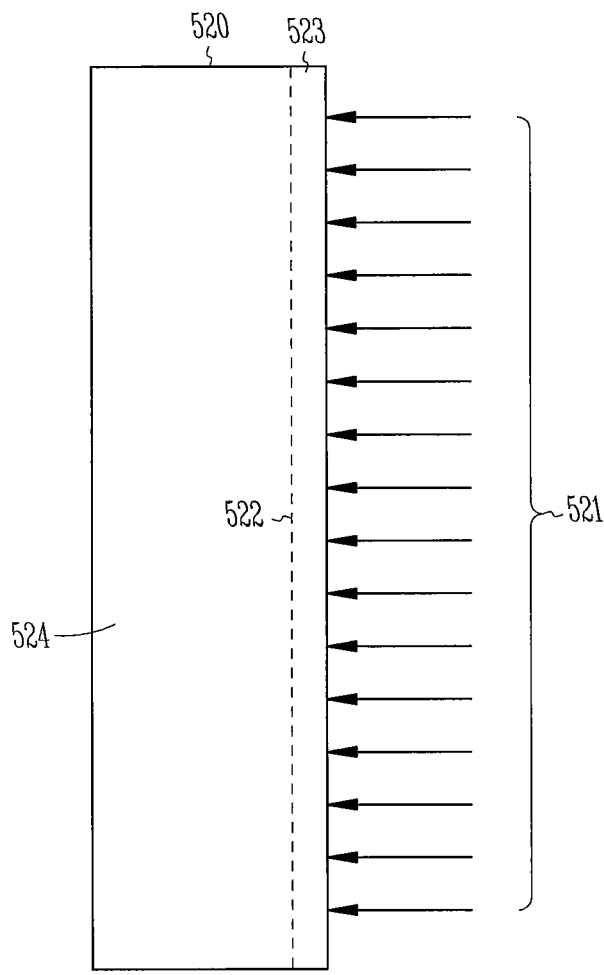
Figure 5E:
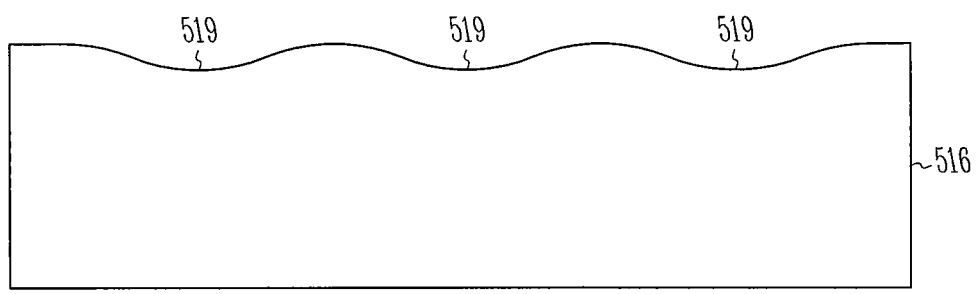

FIG. 5D illustrates a sacrificial semiconductor wafer 520, and FIG. 5E illustrates a semiconductor substrate 516. The substrate 516 includes a semiconductor material, and includes a number of recesses 519, such as illustrated in FIG. 5C. In various embodiments, the semiconductor material includes one of the following materials: silicon; germanium; silicon-germanium; gallium arsenide; indium phosphide; and other semiconductor materials. This list of potential semiconductor materials is not intended to be an all-inclusive list. The substrate is cut into wafer size patterns, and integrated circuits are formed thereon. In various embodiments, the sacrificial wafer includes various semiconductor material including but not limited to silicon, germanium, silicon-germanium, gallium arsenide, indium phosphide, and other semiconductor materials.

Figure 5F:
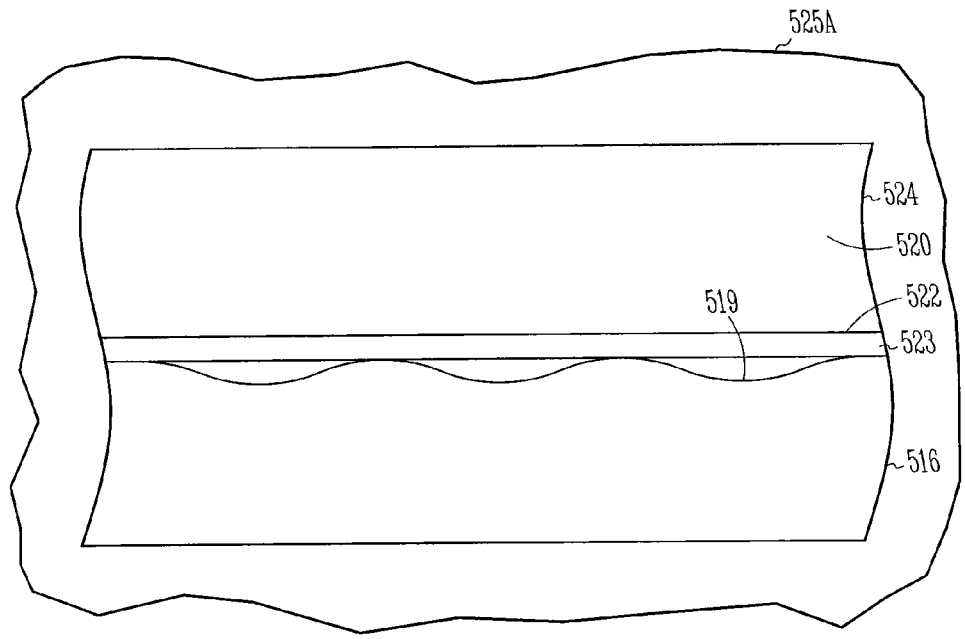
Figure 5G:
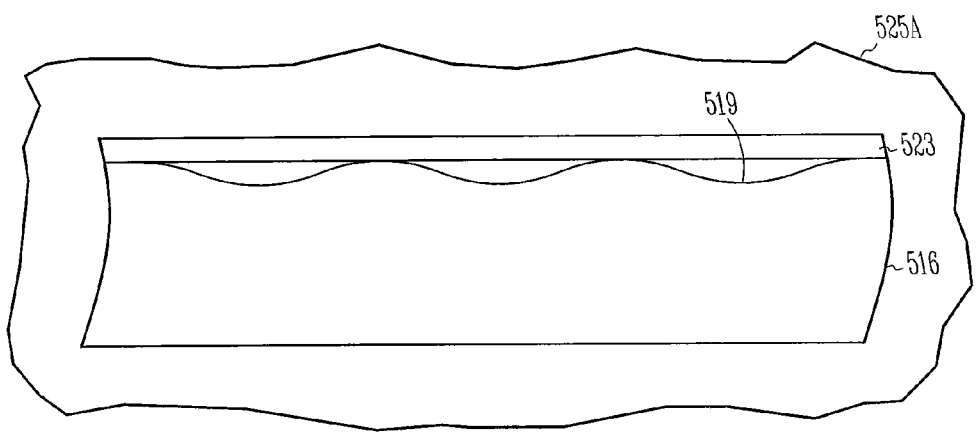

The sacrificial wafer 520 is a single crystal wafer, and is conditioned by implanting ions 521 into a surface. The ions are implanted along a plane, represented in FIG. 5D as a line 522, to define a surface layer 523 with a predetermined thickness. The plane is approximately parallel to the surface in which the ions are implanted. In various embodiments, hydrogen ions are used as implantation ions. The hydrogen ions can include $H^+$, $H_2^+$, $D^+$, and/or $D_2^+$ ions. The implanted ions act to form cavities along the plane 522. The cavities are joined through thermal processing, allowing the surface layer 523 to be removed from the remaining portion of the sacrificial wafer 524 at the cleavage plane 522. In various embodiments, this thermal processing occurs while the surface layer 523 is being bonded to the substrate 516, as shown in FIG. 5F. Once these cavities join and the surface layer is bonded to the substrate, the surface layer breaks off of the sacrificial wafer at the cleavage plane and remains bonded to the substrate. The remaining portion of the sacrificial wafer 524 can be used to form membranes for other substrates, thus reducing the overall cost for the manufacturing process of a wide variety of electronic devices.

FIG. 5F illustrates the surface layer 523 of the sacrificial wafer 520 bonded to the substrate 516. Before the surface layer is bonded to the substrate, the sacrificial wafer and the substrate can be cleaned using conventional cleaning procedures. In various embodiments, the bonding force includes the strong Van der Waal's force that naturally bonds surfaces together as the bonding force. In various embodiments, the Van der Waal's force provides an initial bonding force that is strengthened during subsequent thermal processing. As illustrated in FIG. 5F, the surface layer 523 of the sacrificial wafer 520 is bonded to the substrate 516 in an environment 525A at a first pressure. In various embodiments, the first pressure is a vacuum or a low pressure near a vacuum.

In various embodiments, the bonded wafers are heated to further bond the surface layer to the substrate and to cut the surface layer 523 from the sacrificial wafer. In various embodiments, the environment 525A has a bonding temperature within a range of approximately 300° C. to 400° C. Heating the sacrificial wafer joins the cavities in the cleavage plane 522, allowing the remaining portion 524 of the sacrificial wafer to be removed from the surface layer, which remains bonded to the substrate. The remaining portion 524 of the sacrificial wafer can be prepared and conditioned for another bond cut process.

The thickness of the surface layer 523 bonded to the substrate 516 is defined by the depth of ion implantation 521 during the bond cut process. In various embodiments, the thickness of the surface layer 523 is such that it does not yield or otherwise plastically deform under the desired mechanical strain induced by the bond. In various embodiments, the thickness of the surface layer 523 is less than 200 nm, such that it can be termed an ultra thin wafer. In various embodiments, the silicon layer has a thickness of about 0.1 microns (100 nm or 1000 Å). In various embodiments, the silicon layer has a thickness less than 0.1 microns. In various embodiments, the silicon layer has a thickness in a range of approximately 300 Å to 1000 Å.

In various embodiments, the silicon film is prepared for transistor fabrication. In various embodiments, the preparation of the film includes grinding, polishing, chemical etch, chemical etch with etch stops, and/or plasma assisted chemical etch, and the like, which can be used to further thin the film. Thus, the membrane bonded to the substrate illustrated in FIG. 5G can be thinner than the surface layer defined in the sacrificial layer in FIG. 5D. Device processing can be accomplished using conventional processes and procedures.

Figure 5H:
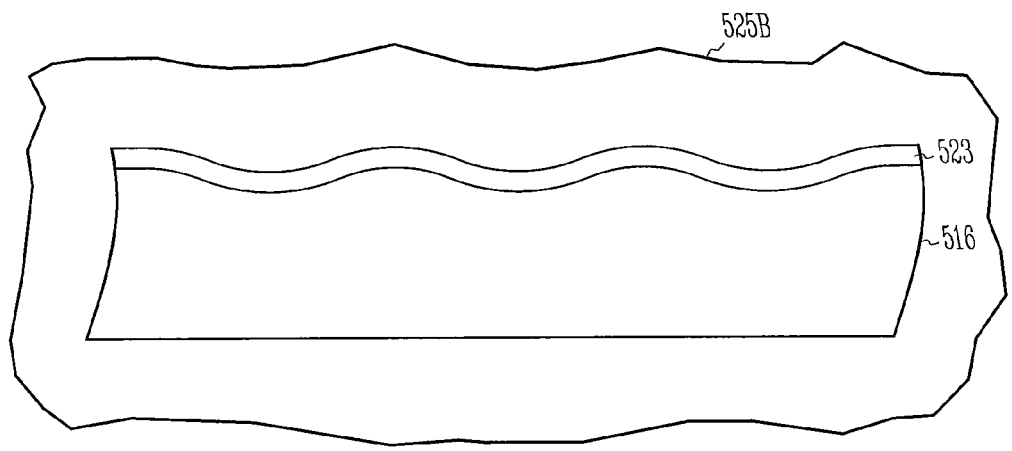

FIG. 5H illustrates the membrane 523 further bonded to the substrate 516 in the recesses 519 formed therein. The process is performed in an environment 525B having a second temperature. The second pressure is greater than the first pressure to force the membrane into the recesses. The volume between the membrane and the recessed substrate is a sealed volume, such that the pressure inside these volumes is approximately the first pressure. In various embodiments, the second pressure is atmospheric pressure. In various embodiments, the environment 525B has a bonding temperature within a range of approximately 800° C. to 1000° C. The portion of the membrane bonded to the substrate in the recesses is strained. One of ordinary skill in the art will understand, upon reading and comprehending this disclosure, that the recesses can be made with appropriate dimension to provide a desired tensile strain.

Figure 5I:
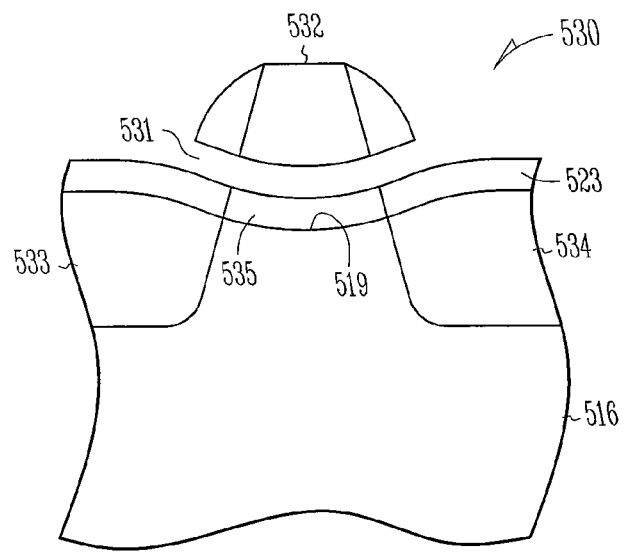

FIG. 5I illustrates a transistor fabricated with a strained semiconductor membrane, according to various embodiments. The illustrated transistor 530 includes a crystalline semiconductor substrate 516 with a recess 519, and a crystalline semiconductor membrane 523 bonded to the substrate 516 to provide the membrane 523 with a desired tensile strain in the recesses. A gate dielectric 531 is formed on the strained membrane, and a gate 532 is formed on the gate dielectric 531. First and second diffusion regions 533 and 534 are formed in the structure 530. The tensile strained semiconductor membrane 523 between the first and second diffusion regions 533 and 534 forms a tensile strained channel region 535.

Various embodiments tensile strain a thin semiconductor layer, such as a silicon layer, with a strain greater than 0.5% to achieve significant mobility enhancement. For further mobility enhancement, various embodiments tensile strain a thin semiconductor wafer, such as an ultra-thin silicon wafer with a thickness within a range of approximately 300 Å to 1000 Å, with a strain within a range of approximately 0.75% to approximately 1.5%. Various embodiments tensile strain a thin semiconductor layer, such as a thin silicon layer, with a strain in the range of approximately 1% to approximately 1.2% to reduce unnecessary strain and provide a margin of error without unduly affecting mobility enhancement. In various embodiments, the film is approximately 1000 Å or less. In various embodiments, the channel length of the transistor is less than or equal to about 1000 Å, and the thickness of the film is less than or equal to about 300 Å. The strain enhances mobility in the channel, thus overcoming problems associated with heavy channel doping.

Compressive Strain Embodiment

FIGS. 6A-6K illustrate an embodiment where a semiconductor layer is bonded to compressive strain the semiconductor layer, such as is provided in U.S. patent application Ser. No. 11/356,335, filed Feb. 16, 2006 and entitled "Localized Compressive Strained Semiconductor." U.S. patent application Ser. No. 11/356,335 is incorporated by reference herein in its entirety. The description that follows refers to embodiments with silicon and silicon dioxide or oxide. However, those of ordinary skill in the art will understand how to implement the teachings herein with other semiconductors and insulators.

Figure 6A:
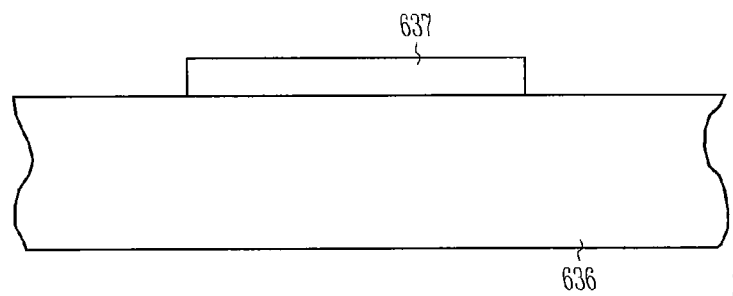
FIGS. 6A-6K illustrate an embodiment where a semiconductor layer is bonded to compressive strain the semiconductor layer.

FIG. 6A illustrates a crystalline silicon substrate 636 with a mask layer 637. The mask layer is patterned to define the areas where there will be localized compressive strain. Thus, the defined areas are used to provide a channel with compressive strain to improve hole mobility for p-channel transistors. In various embodiments, the mask is a silicon nitride. A thin native oxide is between the silicon nitride and the crystalline silicon substrate.

Figure 6B:
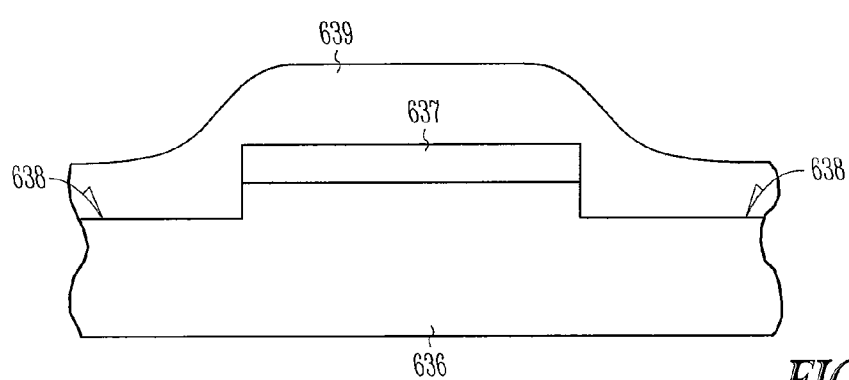
Figure 6C:
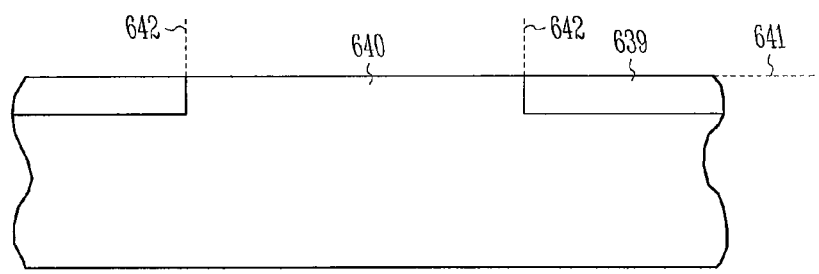
Figure 6D:
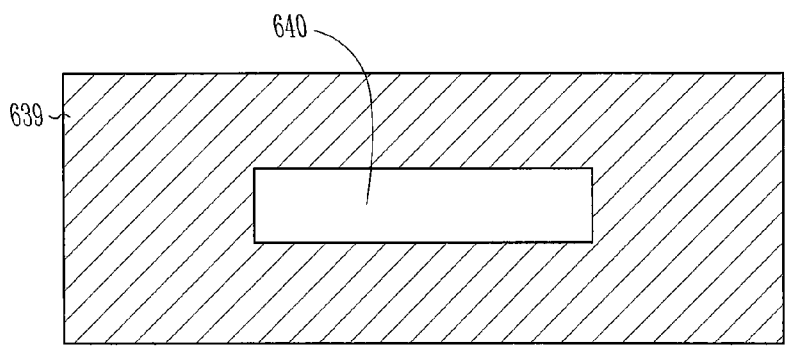

As illustrated in FIG. 6B, the exposed crystalline silicon 636 is etched at 638 to a desired depth on each side of the mask 637. A thick oxide layer 639 is deposited. The resulting structure is planarized, such as may be performed by a chemical mechanical planarization (CMP) process. The planarizing process stops on the raised silicon areas 640 to leave islands or strips of silicon 640 embedded in an oxide 639, such as is illustrated in the side view of FIG. 6C and the top view of FIG. 6D.

Figure 6E:
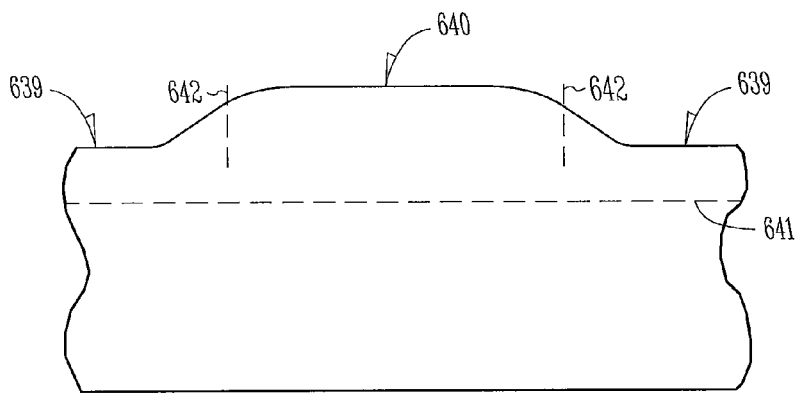

FIG. 6E illustrates the structure after an oxidation process. The dotted line 641 corresponds to the top surface 641 of the structure illustrated in FIG. 6C, and the dotted lines 642 correspond to the edges 642 of the oxide islands in FIG. 6C. The exposed silicon island 640 oxides rapidly, while the regions covered by the deposited oxide 639 oxidize much more slowly. The thickness of the deposited oxide and the subsequent oxidation is timed to leave the resulting silicon surface planar under the oxides of different thickness, and to provide the desired strain, as will be evident upon reading and comprehending this specification.

Figure 6F:
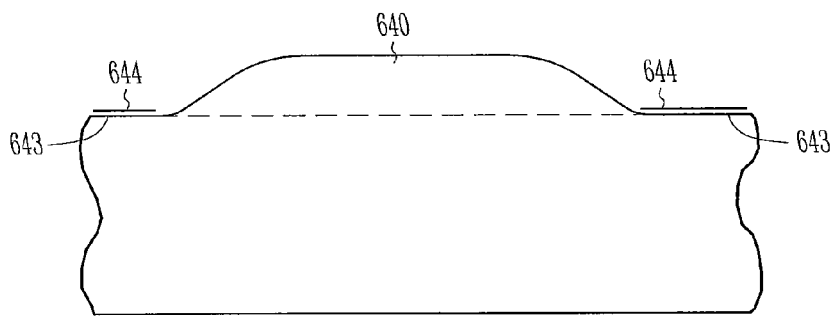

FIG. 6F illustrates the structure after the oxide is etched back to expose the crystalline substrate 643 and reduce the oxide in the island portion 640 of the oxide. A "bird's beak" is left at the edges of the oxide islands. The bird's beak has a similar shape to that formed by a LOCal Oxidation of Silicon (LOCOS) process. A native oxide 644 forms on the exposed silicon areas by exposure to air, water or peroxide.

Figure 6G:
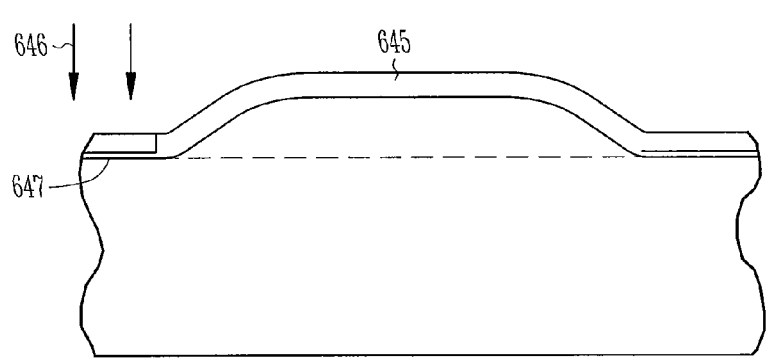
Figure 6H:
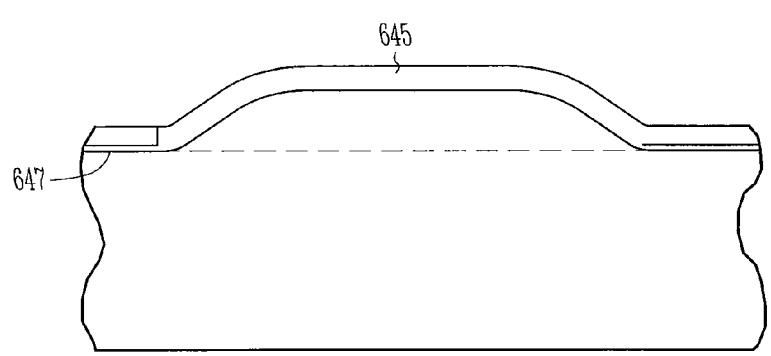

FIGS. 6G-6H illustrate methods for providing an amorphous silicon layer in contact with the crystalline silicon on one side of the oxide island, according to various embodiments. As illustrated in FIG. 6G, an amorphous silicon layer 645 is deposited, and a silicon implant 646 breaks up the oxide such that the crystalline silicon substrate at 647 is able to seed the crystalline growth of the amorphous silicon layer. As illustrated in FIG. 6H, the native oxide is removed at 647 from one side of the oxide island and amorphous silicon 645 is deposited and patterned over the oxide islands. According to various embodiments, the thickness of the silicon film is within a range from approximately 100 nm to approximately 200 nm. Such thicknesses are capable of being mechanically compressed without affecting yield.

Figure 6I:
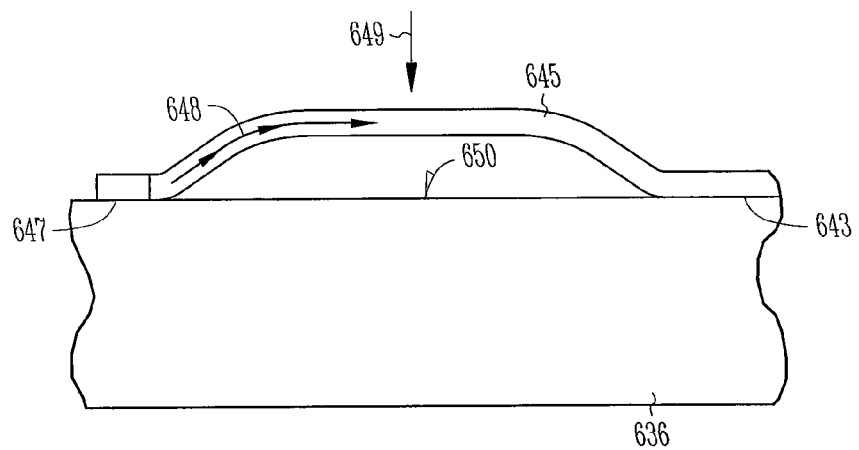

FIG. 6I illustrates a recrystallization process for the amorphous silicon layer, and further illustrates the bonding of the crystallized layer after the oxide island is removed. The recrystallization process is also referred to as a solid phase epitaxial (SPE) process, which includes depositing a thin amorphous silicon layer and annealing the structure to recrystallize the amorphous silicon, where one end of the amorphous layer is seeded to promote a desired crystalline growth. The recrystallization, as illustrated by the arrows 648, is seeded at 647 where the silicon layer 645 is in direct contact with the crystalline silicon substrate 636, and thus only grows from one side since the other side still has the unperturbed native oxide 643. According to various embodiments, the silicon film is recrystallized at temperatures from approximately 550° C. to approximately 700° C. The transistor channel is formed in this recrystallized silicon strip. The oxide island is etched from underneath the silicon strip to leave an empty space beneath the silicon strip. As illustrated by the arrow 649, a silicon strip or silicon bridge layer is influenced toward and bonded to the surface beneath the silicon layer. In various embodiments, the naturally occurring Van der Waal's force is sufficient to influence the bridge layer or film 645 into contact with the surface 650 beneath the silicon layer. In various embodiments, a nano-imprint mask is used to assist with influencing the film into contact with the surface beneath the silicon layer.

Figure 6J:
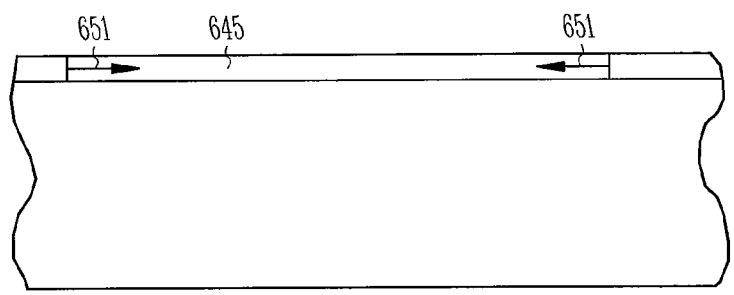

FIG. 6J illustrates the silicon layer bonded to the surface beneath the silicon layer. Since the length of the bowed silicon film strip is longer than the planar surface region of the silicon substrate, the film 645, now in crystalline form, will be under compressive stress, as illustrated by the arrows 651, after bonding to the substrate surface.

Figure 6K:
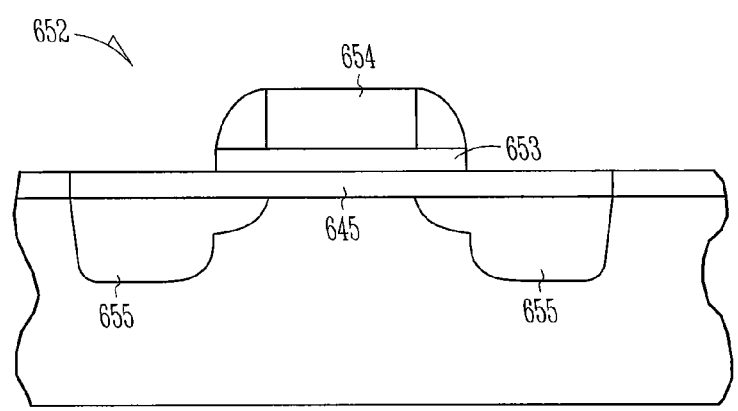

FIG. 6K illustrates a PMOS transistor 652 fabricated in the structure formed with crystalline silicon under compression. The remaining steps in the PMOS transistor fabrication can be achieved by conventional techniques, in which the compressively-strained ultra-thin silicon strip 645 forms the transistor channel region. For example, a gate insulator 653, such as silicon oxide or other gate insulator, is formed on the structure, a gate 654 is formed on the gate insulator, and source/drain regions 655 are formed to define a channel 645 beneath the gate and between the source/drain regions. The source/drain regions can be formed by an ion implantation process.

Locally Strained Semiconductor Embodiment

Figure 7:
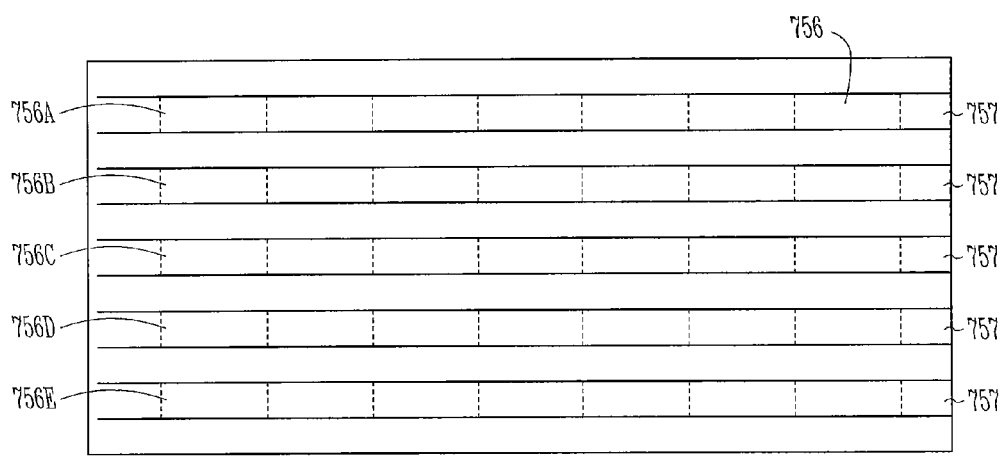
FIG. 7 illustrates a top view of a structure in which a plurality of transistors are being formed, according to various embodiments.
Figure 8:
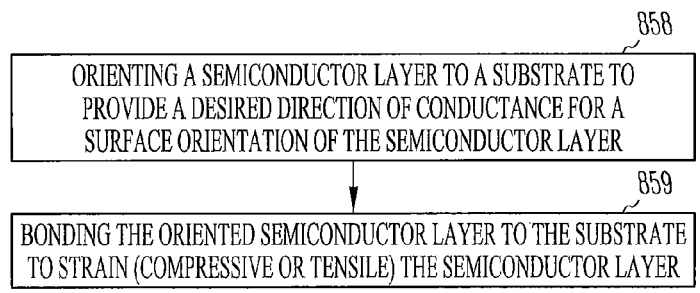
FIGS. 8-14 illustrate various methods for straining semiconductor layers.

FIG. 7 illustrates a top view of a structure in which a plurality of transistors are being formed, according to various embodiments. The oxide 756 is illustrated by the dotted line and the pattern of silicon strips 757 is also illustrated. In another embodiment, a number of oxide regions are combined in the column direction to form one oxide area. For example, the column of oxide regions 756A-756E can be formed as one oxide area. As discussed above, these oxide areas can be used to provide a local tensile strain to the silicon strips or a local compressive strain to the silicon strips. According to various embodiments, the same substrate includes silicon strips with both locally tensile strained regions to promote electron mobility and locally compressive strained regions to promote hole mobility.

Surface Orientation/Conductance Direction

FIGS. 8-13 illustrate various methods for straining semiconductor layers. With reference to the embodiment illustrated in FIG. 8, as illustrated at 858 a semiconductor layer is oriented to a substrate to provide a desired direction of conductance of a surface orientation of the semiconductor layer. In embodiments in which strips of semiconductor are bonded to the substrate, the strips are formed in the direction of conductance. Other embodiments use larger membranes or films. The surface crystal orientation is conventionally provided using Miller indices in parentheses. The direction of conduction is provided using X Y Z coordinates in angle brackets, and is based on the same coordinate system used to identify the surface orientation of the semiconductor layer. For a given surface crystal orientation, some directions are more conductive than others. At 859, the oriented semiconductor layer is bonded to the substrate to strain the semiconductor layer. Various embodiments induce a compressive strain and various embodiments induce a tensile strain when the layer is bonded to the substrate. The thickness of the layer is sufficiently thin to permit the strain without yield. Various embodiments create the layer using a bond cut process, such as illustrated in FIGS. 5D-5G. Various embodiments remove the back of a sacrificial wafer, which has been bonded to the substrate, by a mechanical and chemical etch procedure. Various embodiments create the layer by depositing an amorphous layer and recrystallizing the layer using a solid phase epitaxial process, such as illustrated in FIGS. 6G-I.

Figure 9:
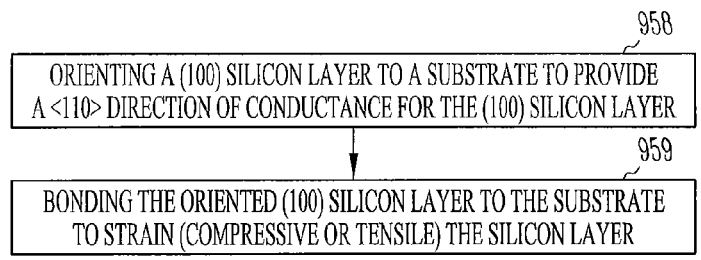

FIG. 9 illustrates an embodiment of a method of bonding a (100) silicon layer to provide desired conductance in the <110> direction. In embodiments in which strips of silicon are bonded to the substrate, the strips are formed in the <110> direction. At 958, a (100) silicon layer is oriented to a substrate to provide a <110> direction of conductance for the (100) silicon layer. At 959, the oriented (100) silicon layer is bonded to the substrate to strain the silicon layer. Various embodiments bond the layer onto raised oxide areas on any carrier wafer to improve hole mobility by removing the oxide from under the strips and completing the bonding to leave the strip in compressive stress. Various embodiments bond the silicon layer over recessed oxide areas on any carrier wafer to improve electron mobility by removing the oxide from under the strips and completing the bonding to leave the strip in tensile stress.

Figure 10:
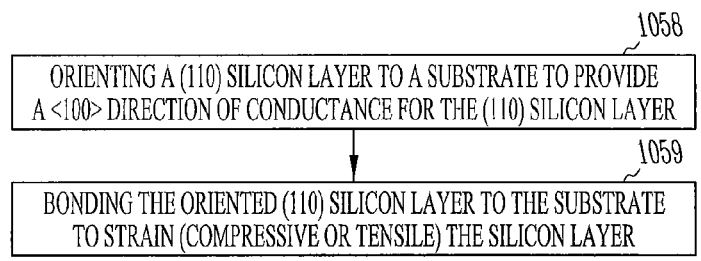

FIG. 10 illustrates an embodiment of a method of bonding a (110) silicon layer to provide desired conductance in the <100> direction. Other directions of conductance can be used with respect to the (110) silicon layer. In embodiments in which strips of silicon are bonded to the substrate, the strips are formed in the <100> direction. At 1058, a (110) silicon layer is oriented to a substrate to provide a <100> direction of conductance for the (110) silicon layer. At 1059, the oriented (110) silicon layer is bonded to the substrate to strain the silicon layer. Various embodiments bond the layer onto raised oxide areas on any carrier wafer to improve hole mobility by removing the oxide from under the strips and completing the bonding to leave the strip in compressive stress. Various embodiments bond the silicon layer over recessed oxide areas on any carrier wafer to improve electron mobility by removing the oxide from under the strips and completing the bonding to leave the strip in tensile stress.

Figure 11:
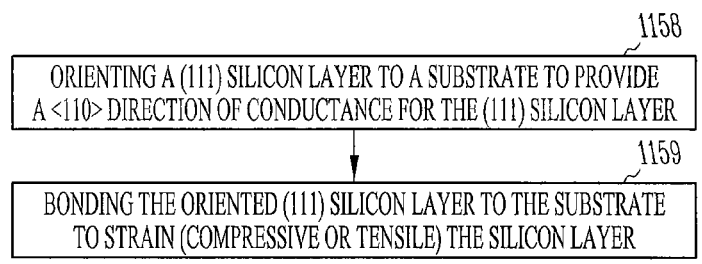

FIG. 11 illustrates an embodiment of a method of bonding a (111) silicon layer to provide desired conductance in the <110> direction. In embodiments in which strips of silicon are bonded to the substrate, the strips are formed in the <110> direction. At 1158, a (111) silicon layer is oriented to a substrate to provide a <110> direction of conductance for the (111) silicon layer. At 1159, the oriented (111) silicon layer is bonded to the substrate to strain the silicon layer. Various embodiments bond the layer onto raised oxide areas on any carrier wafer to improve hole mobility by removing the oxide from under the strips and completing the bonding to leave the strip in compressive stress. Various embodiments bond the silicon layer over recessed oxide areas on any carrier wafer to improve electron mobility by removing the oxide from under the strips and completing the bonding to leave the strip in tensile stress.

Figure 12:
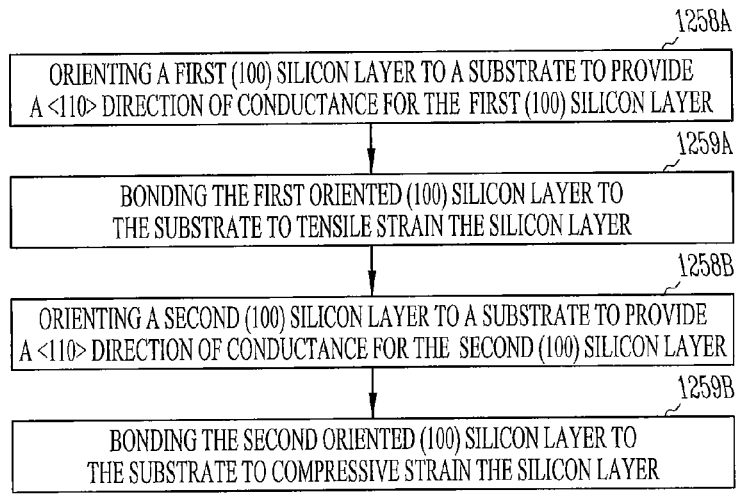

FIG. 12 illustrates an embodiment of a method of bonding (100) silicon layers to provide desired conductance in the <110> direction. As illustrated at 1258A and 1259A, a first (100) silicon layer is oriented to a substrate to provide a <110> direction of conductance of the first (100) silicon layer, and the first (100) silicon layer is bonded to the substrate to tensile strain the first silicon layer. As illustrated in 1258B and 1259B, a second (100) silicon layer is oriented to a substrate to provide a <110> direction of conductance of the first (100) silicon layer, and the second (100) silicon layer is bonded to the substrate to compressive strain the second silicon layer. Thus, on a same substrate, the strips with local tensile stress improve the mobility of n-channel MOSFETs and the strips with local compressive stress improve hole mobility of p-channel MOSFETs. Thus, the present subject matter can be implemented in CMOS design.

Figure 13:
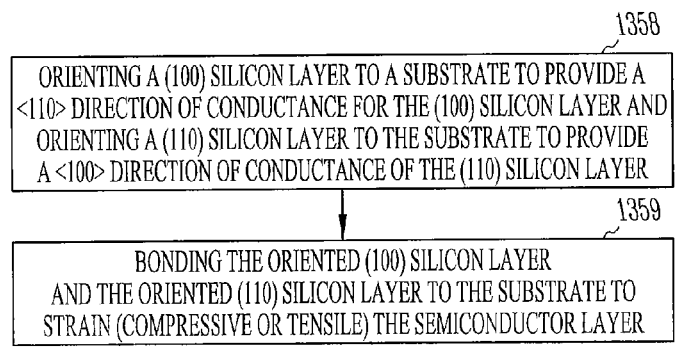

FIG. 13 illustrates an embodiment of a method of bonding a (100) silicon layer to provide a desired conductance in the <110> direction and bonding a (110) silicon layer to provide a desired conductance in the <100> direction. At 1358, a (100) silicon layer is oriented to a substrate to provide a <110> direction of conductance and a (110) silicon layer is oriented to the substrate to provide a <100> direction of conductance. At 1359, the oriented (100) silicon layer and the oriented (110) silicon layer are bonded to the substrate to strain the semiconductor layers. Local strain for either the (100) layer or the (110) layer can be either tensile strain or compressive strain. Since in this case the strips will all have the same height above the smooth surface of the carrier wafer the backs of the strips can also be mechanically polished as well as chemically polished. Removing the oxide from under the strips and completing the bonding will leave the strips in tensile stress improving the mobility of both electrons and holes in MOSFETs. The MOSFETs can be fabricated using conventional techniques.

Figure 14:
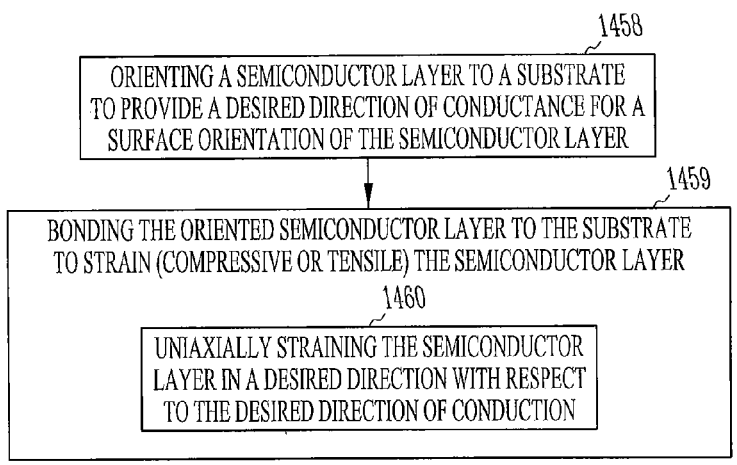

The direction of a uniaxial strain can affect the carrier mobility. For example, as reported by Irie et al., "In-Plane Mobility Anisotropy and Universality Under Uni-Axial Strains In N- and P-MOS Inversion Layers On (100), (110), and (111) Si," IEDM Technical Digest, 13-15 Dec. 2004, pp. 224-228, a <110> channel direction and a tensile strain direction in the <110> direction is desirable for improved electron mobility in a (100) silicon layer and a <100> channel direction and a tensile strain in the <100> direction is desirable for improved hole mobility in a (110) silicon layer. Thus, various embodiments uniaxially strain the semiconductor layer in a desired direction with respect to the desired direction for conduction to improve carrier mobility. With reference to FIG. 14, at 1458 a semiconductor layer is oriented to a substrate to provide a desired direction of conductance for a surface orientation of the semiconductor layer. At 1459 the oriented semiconductor layer is bonded to the substrate to strain the semiconductor layer. As illustrated by 1460, the bonding process includes uniaxially straining the semiconductor layer in a desired direction with respect to the desired direction of conduction to improve conductance.

Device/System Embodiments

Figure 15:
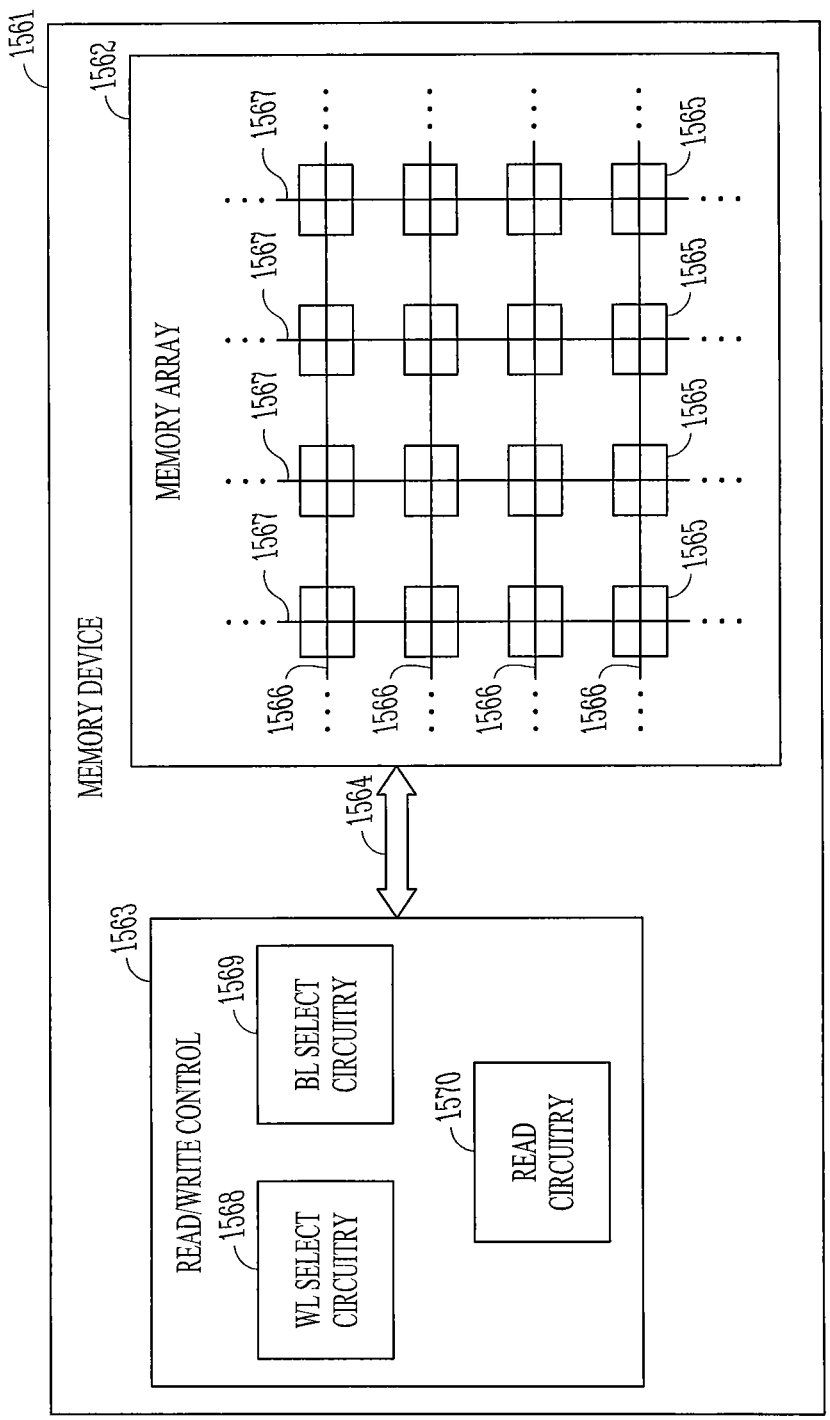
FIG. 15 is a simplified block diagram of a high-level organization of a memory device according to various embodiments.

FIG. 15 is a simplified block diagram of a high-level organization of various embodiments of a memory device according to various embodiments of the present subject matter. The illustrated memory device 1561 includes a memory array 1562 and read/write control circuitry 1563 to perform operations on the memory array via communication line(s) or channel(s) 1564. The illustrated memory device 1561 may be a memory card or a memory module such as a single inline memory module (SIMM) and dual inline memory module (DIMM). One of ordinary skill in the art will understand, upon reading and comprehending this disclosure, that semiconductor components in the memory array and/or the control circuitry are able to be fabricated using the strained semiconductor, as described above. For example, in various embodiments, the memory array and/or the control circuitry include p-channel transistors with improved hole mobility and/or n-channel transistors with improved electron mobility, as disclosed herein. The structure and fabrication methods for these devices have been described above.

The illustrated memory array 1562 includes a number of memory cells 1565 arranged in rows and columns, where word lines 1566 connect the memory cells in the rows and bit lines 1567 connect the memory cells in the columns. The read/write control circuitry 1563 includes word line select circuitry 1568, which functions to select a desired row. The read/write control circuitry 1563 further includes bit line select circuitry 1569, which functions to select a desired column. The read/write control circuitry 1563 further includes read circuitry 1570, which functions to detect a memory state for a selected memory cell in the memory array 1562.

Figure 16:
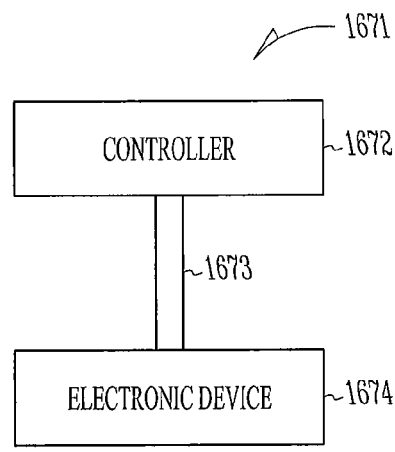
FIG. 16 illustrates a diagram for an electronic system having one or more transistors with strained channels for improved mobility, according to various embodiments.

FIG. 16 illustrates a diagram for an electronic system having one or more transistors with strained channels for improved mobility, according to various embodiments of the present subject matter. Electronic system 1671 includes a controller 1672, a bus 1673, and an electronic device 1674, where the bus 1673 provides communication channels between the controller 1672 and the electronic device 1674. In various embodiments, the controller and/or electronic device include p-channel transistors with improved hole mobility and/or n-channel transistors with improved electron mobility, as disclosed herein. The illustrated electronic system 1671 may include, but is not limited to, information handling devices, wireless systems, telecommunication systems, fiber optic systems, electrooptic systems, and computers.

Figure 17:
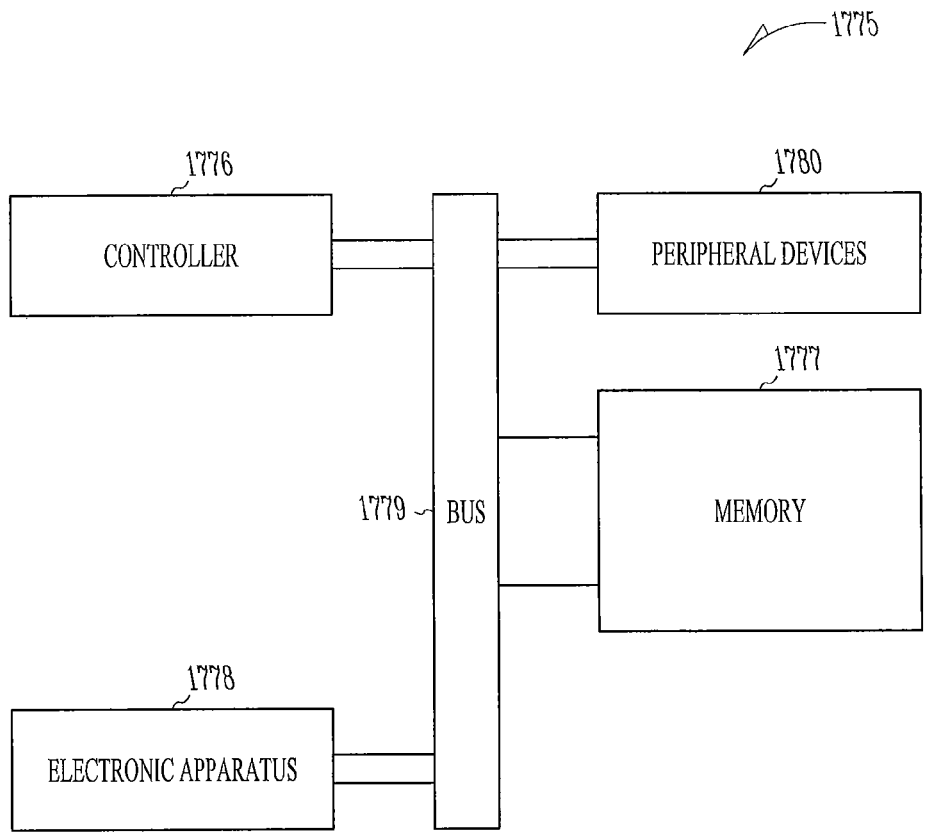
FIG. 17 illustrates an embodiment of a system having a controller and a memory, according to various embodiments.

FIG. 17 illustrates an embodiment of a system 1775 having a controller 1776 and a memory 1777, according to various embodiments of the present subject matter. The controller 1776 and/or memory 1777 may include p-channel transistors with improved hole mobility and/or n-channel transistors with improved electron mobility, as disclosed herein. The illustrated system 1775 also includes an electronic apparatus 1778 and a bus 1779 to provide communication channel(s) between the controller and the electronic apparatus, and between the controller and the memory. The bus may include an address, a data bus, and a control bus, each independently configured; or may use common communication channels to provide address, data, and/or control, the use of which is regulated by the controller. In an embodiment, the electronic apparatus 1778 may be additional memory configured similar to memory 1777. An embodiment may include a peripheral device or devices 1780 coupled to the bus 1779. Peripheral devices may include displays, additional storage memory, or other control devices that may operate in conjunction with the controller and/or the memory. In an embodiment, the controller is a processor. Any of the controller 1776, the memory 1777, the electronic apparatus 1778, and the peripheral devices 1780 may include p-channel transistors with improved hole mobility and/or n-channel transistors with improved electron mobility, as disclosed herein. The system 1775 may include, but is not limited to, information handling devices, telecommunication systems, and computers. Applications containing strained semiconductor films as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as cameras, video recorders and players, televisions, displays, games, phones, clocks, personal computers, wireless devices, automobiles, aircrafts, industrial control systems, and others.

The memory may be realized as a memory device containing p-channel transistors with improved hole mobility and/or n-channel transistors with improved electron mobility, as disclosed herein. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM).

This disclosure includes several processes, circuit diagrams, and semiconductor structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A method, comprising:
   orienting a semiconductor layer to a substrate, the substrate having a direction of conduction for an integrated circuit to be fabricated using the substrate; and
   bonding the oriented semiconductor layer to the substrate, wherein bonding the oriented semiconductor layer to the substrate strains the oriented semiconductor layer,
   wherein:
      the semiconductor layer has a surface orientation, before the semiconductor layer is bonded to the substrate, for which a desired direction of conduction is more conductive than other directions; and
      orienting the semiconductor layer to the substrate includes:
         identifying the desired direction of conduction for the semiconductor layer before bonding the semiconductor layer to the substrate; and aligning the desired direction of conduction for the semiconductor layer with the direction of conduction of the substrate to orient the semiconductor layer to the substrate before bonding the oriented semiconductor layer to the substrate, and bonding the oriented semiconductor layer to the substrate strains the oriented semiconductor layer in a desired direction of strain to promote carrier mobility in the desired direction of conduction.

2. The method of claim 1, wherein bonding the oriented semiconductor layer to the substrate to strain the semiconductor layer includes uniaxially straining the semiconductor layer in a desired direction with respect to the desired direction of conduction, wherein bonding the oriented semiconductor layer to the substrate to strain the semiconductor layer includes:

forming a number of recesses in a surface of the substrate such that the surface of the substrate has a number of raised areas and a number of recessed areas;

bonding a surface of a second semiconductor wafer to the raised areas of the substrate in an environment having a first pressure; and bonding the surface of the second semiconductor wafer to the recessed areas of the substrate in an environment having a second pressure, the second pressure being greater than the first pressure to influence the second semiconductor wafer into contact with the substrate in the recesses in the surface of the substrate, and wherein forming the number of recesses in the surface incudes forming the recesses to provide the semiconductor layer with the desired direction of uniaxial strain to promote carrier mobility in the desired direction of conduction.

3. The method of claim 1, wherein the strain includes a tensile strain.

4. The method of claim 1, wherein the strain includes a compressive strain.

5. The method of claim 1, wherein the semiconductor layer includes a silicon layer.

6. The method of claim 1, wherein the substrate includes a silicon substrate, and bonding the oriented semiconductor layer to the substrate includes bonding the semiconductor layer to silicon.

7. The method of claim 1, wherein bonding the oriented semiconductor layer to the substrate to strain the semiconductor layer includes:

forming a number of recesses in a surface of the substrate such that the surface of the substrate has a number of raised areas and a number of recessed areas;

bonding a surface of a second semiconductor wafer to the raised areas of the substrate in an environment having a first pressure; and bonding the surface of the second semiconductor wafer to the recessed areas of the substrate in an environment having a second pressure, the second pressure being greater than the first pressure to influence the second semiconductor wafer into contact with the substrate in the recesses in the surface of the substrate.

8. The method of claim 7, further comprising heat-treating the second semiconductor wafer and the substrate to strengthen a bond between the second semiconductor wafer and the substrate.

9. The method of claim 7, further comprising forming the semiconductor layer from a sacrificial silicon semiconductor wafer using a bond-cut process.

10. The method of claim 7, wherein forming a number of recesses in a surface of the substrate includes forming the number of recesses such that, upon bonding the surface of the second semiconductor wafer to the recessed areas of the substrate in an environment having a second pressure, the second semiconductor wafer has an uniaxial strain.

11. The method of claim 7, wherein:

bonding a surface of a second semiconductor wafer to the raised areas of the first substrate in an environment having a first pressure includes bonding the surface of the second semiconductor wafer to the raised areas of the substrate in a vacuum; and bonding the surface of the second semiconductor wafer to the recessed areas of the substrate in an environment having a second pressure includes bonding the surface of the second semiconductor wafer to the recessed areas of the substrate in an atmospheric pressure.

12. The method of claim 7, wherein forming a number of recesses in a surface of the substrate includes forming the number of recesses with desired dimensions such that, upon bonding the surface of the second semiconductor wafer to the recessed areas of the substrate in an environment having a second pressure, the second semiconductor wafer has a strain greater than 0.5%.

13. The method of claim 7, wherein forming a number of recesses in a surface of the substrate includes forming the number of recesses with desired dimensions such that, upon bonding the surface of the second semiconductor wafer to the recessed areas of the substrate in an environment having a second pressure, the second semiconductor wafer has a strain within a range between approximately 0.75% and approximately 1.5%.

14. The method of claim 7, wherein forming a number of recesses in a surface of the substrate includes forming the number of recesses with desired dimensions such that, upon bonding the surface of the second semiconductor wafer to the recessed areas of the substrate in an environment having a second pressure, the second semiconductor wafer has a strain within a range between approximately 1.0% and approximately 1.2%.

15. The method of claim 7, wherein forming a number of recesses includes performing a Local Oxidation of Silicon (LOCOS) process to form a number of oxide regions in the substrate, and removing the oxide regions from the substrate.

16. The method of claim 15, wherein performing a Local Oxidation of Silicon (LOCOS) process includes forming at least one of the oxide regions to have a length of about 1000 Å and a thickness of approximately 300 Å such that the oxide region extends about 150 Å below the raised areas of the substrate.

17. The method of claim 7, wherein the semiconductor layer has a thickness of approximately 1000 Å or less.

18. The method of claim 7, wherein the semiconductor layer has a thickness in a range approximately 300 Å to approximately 1000 Å.

19. The method of claim 1, wherein bonding the oriented semiconductor layer to the substrate to strain the semiconductor layer includes:

forming a crystalline semiconductor bridge over the substrate, the bridge having a first portion bonded to the substrate, a second portion bonded to the substrate, and a middle portion between the first and second portions separated from the substrate; and bonding the middle portion of the bridge to the substrate to provide a compressed crystalline semiconductor layer on the substrate.

20. The method of claim 19, wherein the compressed crystalline semiconductor layer has a compression within a range of approximately 0.2% and 1.0%.

21. The method of claim 19, wherein the substrate is a crystalline substrate, the first portion is in contact with the crystalline substrate to seed a crystalline growth of an amorphous layer to form the crystalline semiconductor layer, and the second portion is separated from the crystalline substrate by an oxide.

22. The method of claim 19, wherein the compressed crystalline semiconductor layer has a thickness within a range of approximately 10 nm to approximately 20 nm.

23. The method of claim 19, wherein forming a crystalline semiconductor bridge includes:
    forming an oxide adapted to separate the middle portion of the bridge from the substrate;
    forming an amorphous semiconductor layer over the oxide; and
    heat treating the amorphous semiconductor layer to crystallize the semiconductor layer.

24. The method of claim 23, wherein bonding the middle portion of the bridge to the surface includes removing the oxide that separates the middle portion of the bridge from the surface.

25. A method, comprising:
    orienting a silicon layer to a substrate, the substrate having a direction of conduction for an integrated circuit to be fabricated using the substrate, the silicon layer having a (100) surface orientation; and
    bonding the oriented silicon layer to the substrate, wherein bonding the oriented silicon layer to the substrate strains the silicon layer,
    wherein:
    the silicon layer has a surface orientation, before the silicon layer is bonded to the substrate, for which a desired direction of conduction is more conductive than other directions; and
    orienting the silicon layer to the substrate includes:
    identifying a <110> direction of conduction for the silicon layer before bonding the silicon layer to the substrate; and
    aligning the <110> direction of conduction for the silicon layer with the direction of conduction of the substrate to orient the silicon layer to the substrate before bonding the oriented silicon layer to the substrate, and
    bonding the oriented silicon layer to the substrate strains the oriented silicon layer in a desired direction of strain to promote carrier mobility in the desired direction of conduction.

26. The method of claim 25, wherein the strain includes a tensile strain.

27. The method of claim 25, wherein the strain includes a compressive strain.

28. A method, comprising:
    orienting a silicon layer to a substrate, the substrate having a direction of conduction for an integrated circuit to be fabricated using the substrate, the silicon layer having a (110) surface orientation, wherein orienting the silicon layer to the substrate includes aligning a <100> direction of conduction for the silicon layer with the direction of conduction of the substrate; and
    bonding the oriented silicon layer to the substrate, wherein bonding the oriented silicon layer to the substrate strains the silicon layer,
    wherein:
    the silicon layer has a surface orientation, before the silicon layer is bonded to the substrate, for which a desired direction of conduction is more conductive than other directions; and
    orienting the silicon layer to the substrate includes:
    identifying the desired direction of conduction for the silicon layer before bonding the silicon layer to the substrate; and
    aligning the desired direction of conduction for the silicon layer with the direction of conduction of the substrate to orient the silicon layer to the substrate before bonding the oriented silicon layer to the substrate, and
    bonding the oriented silicon layer to the substrate strains the oriented silicon layer in a desired direction of strain to promote carrier mobility in the desired direction of conduction.

29. The method of claim 28, wherein the strain includes a tensile strain.

30. The method of claim 28, wherein the strain includes a compressive strain.

31. A method, comprising:
    orienting a silicon layer to a substrate, the substrate having a direction of conduction for an integrated circuit to be fabricated using the substrate, the silicon layer having a (111) surface orientation, wherein orienting the silicon layer to the substrate includes aligning a <110> direction of conduction for the silicon layer with the direction of conduction of the substrate; and
    bonding the oriented silicon layer to the substrate, wherein bonding the oriented silicon layer to the substrate strains the silicon layer,
    wherein:
    the silicon layer has a surface orientation, before the silicon layer is bonded to the substrate, for which a desired direction of conduction is more conductive than other directions; and
    orienting the silicon layer to the substrate includes:
    identifying the desired direction of conduction for the silicon layer before bonding the silicon layer to the substrate; and
    aligning the desired direction of conduction for the silicon layer with the direction of conduction of the substrate to orient the silicon layer to the substrate before bonding the oriented silicon layer to the substrate, and
    bonding the oriented silicon layer to the substrate strains the oriented silicon layer in a desired direction of strain to promote carrier mobility in the desired direction of conduction.

32. The method of claim 31, wherein the strain includes a tensile strain.

33. The method of claim 31, wherein the strain includes a compressive strain.

34. A method, comprising:
    orienting a silicon layer to a substrate, the substrate having a direction of conduction for an integrated circuit to be fabricated using the substrate, the silicon layer having a (100) surface orientation, wherein orienting the silicon layer to the substrate includes aligning a <100> direction of conduction for the silicon layer with the direction of conduction of the substrate; and
    bonding the oriented silicon layer to the substrate, wherein bonding the oriented semiconductor silicon layer to the substrate strains the silicon layer,
    wherein:

the silicon layer has a surface orientation, before the semiconductor layer is bonded to the substrate, for which a desired direction of conduction is more conductive than other directions; and
orienting the silicon layer to the substrate includes:
identifying the desired direction of conduction for the silicon layer before bonding the silicon layer to the substrate; and
aligning the desired direction of conduction for the silicon layer with the direction of conduction of the substrate to orient the silicon layer to the substrate before bonding the oriented silicon layer to the substrate, and
bonding the oriented silicon layer to the substrate strains the oriented silicon layer in a desired direction of strain to promote carrier mobility in the desired direction of conduction.

35. The method of claim 34, wherein bonding the oriented silicon layer to the substrate to strain the silicon layer includes straining the silicon layer in the <100> direction.

36. The method of claim 35, wherein the strain includes tensile strain.

37. A method, comprising:
orienting a silicon layer to a substrate, the substrate having a direction of conduction for an integrated circuit to be fabricated using the substrate, the silicon layer having a (110) surface orientation before the silicon layer is bonded to the substrate; and
bonding the oriented silicon layer to the substrate, wherein bonding the oriented silicon layer to the substrate strains the silicon layer,
wherein orienting the silicon layer to the substrate includes:
identifying a <110> desired direction of conduction for the silicon layer before bonding the silicon layer to the substrate, where the desired direction of conduction is more conductive than other directions; and
aligning the <110> direction of conduction for the silicon layer with the direction of conduction of the substrate to orient the silicon layer to the substrate before bonding the oriented silicon layer to the substrate, and
wherein bonding the oriented silicon layer to the substrate strains the oriented silicon layer in a desired direction of strain to promote carrier mobility in the desired direction of conduction.

38. The method of claim 37, wherein bonding the oriented silicon layer to the substrate to strain the silicon layer includes straining the silicon layer in the <110> direction, wherein the strain includes tensile strain.

39. The method of claim 37, wherein bonding the oriented silicon layer to the substrate to strain the silicon layer includes straining the silicon layer in the <100>, wherein the strain includes compressive strain.

40. A method, comprising:
orienting a silicon layer to a substrate, the substrate having a direction of conduction for an integrated circuit to be fabricated using the substrate, the silicon layer having a (100) surface orientation before the silicon layer is bonded to the substrate; and
bonding the oriented silicon layer to the substrate, wherein bonding the oriented silicon layer to the substrate strains the silicon layer, wherein the strain includes local compressive strain and local tensile strain,
wherein orienting the silicon layer to the substrate includes:
identifying a desired direction of conduction for the silicon layer before bonding the silicon layer to the substrate, where the desired direction of conduction is more conductive than other directions; and
aligning the desired direction of conduction for the silicon layer with the direction of conduction of the substrate to orient the silicon layer to the substrate before bonding the oriented silicon layer to the substrate, and
wherein bonding the oriented silicon layer to the substrate strains the oriented silicon layer in a desired direction of strain to promote carrier mobility in the desired direction of conduction.

41. The method of claim 40, wherein bonding the oriented silicon layer to the substrate to strain the silicon layer includes uniaxially straining the silicon layer in a desired direction with respect to the desired direction of conduction.

42. The method of claim 40, wherein bonding the oriented silicon layer to the substrate to strain the silicon layer includes:
forming a number of recesses in a surface of the substrate such that the surface of the substrate has a number of raised areas and a number of recessed areas;
bonding a surface of a second silicon wafer to the raised areas of the substrate in an environment having a first pressure; and
bonding the surface of the second silicon wafer to the recessed areas of the substrate in an environment having a second pressure, the second pressure being greater than the first pressure to influence the second silicon wafer into contact with the substrate in the recesses in the surface of the substrate.

43. The method of claim 40, wherein bonding the oriented silicon layer to the substrate to strain the silicon layer includes:
forming a crystalline silicon bridge over the substrate, the bridge having a first portion bonded to the substrate, a second portion bonded to the substrate, and a middle portion between the first and second portions separated from the substrate; and
bonding the middle portion of the bridge to the substrate to provide a compressed crystalline silicon layer on the substrate.

44. A method, comprising:
orienting a first silicon layer to a substrate, the substrate having a direction of conduction for an integrated circuit to be fabricated using the substrate, the first silicon layer having a (100) surface orientation, wherein orienting the first silicon layer to the substrate includes identifying a <110> desired direction of conduction for the first silicon layer, where the desired direction of conduction is more conductive than other directions, and aligning the <110> desired direction of conduction for the first silicon layer with the direction of conduction of the substrate before bonding the first silicon layer to the substrate;
orienting a second silicon layer to the substrate, the second silicon layer having a (110) surface orientation, wherein orienting the second silicon layer to the substrate includes identifying a <100> desired direction of conduction for the second silicon layer and aligning the <100> desired direction of conduction for the second silicon layer with the direction of conduction of the substrate; and
bonding the oriented first and second silicon layers to the substrate, wherein bonding the oriented semiconductor silicon layers to the substrate strains the oriented silicon layers in desired directions of strain to promote carrier mobility in the desired directions of conduction.

45. The method of claim 44, wherein bonding the oriented silicon layers to the substrate to strain the silicon layers includes uniaxially straining the silicon layers in a desired direction with respect to the desired directions of conduction.

46. The method of claim 44, wherein bonding the oriented first and second silicon layers to the substrate to strain the silicon layers includes:
   forming a number of recesses in a surface of the substrate such that the surface of the substrate has a number of raised areas and a number of recessed areas;
   bonding a surface of a second silicon wafer to the raised areas of the substrate in an environment having a first pressure; and
   bonding the surface of the second silicon wafer to the recessed areas of the substrate in an environment having a second pressure, the second pressure being greater than the first pressure to influence the second silicon wafer into contact with the substrate in the recesses in the surface of the substrate.

47. The method of claim 44, wherein bonding the oriented silicon layers to the substrate to strain the silicon layers includes: forming a crystalline silicon bridge over the substrate, the bridge having a first portion bonded to the substrate, a second portion bonded to the substrate, and a middle portion between the first and second portions separated from the substrate; and bonding the middle portion of the bridge to the substrate to provide a compressed crystalline silicon layer on the substrate.

48. A method for forming a transistor, comprising:
   forming a strained semiconductor layer on a substrate, the substrate having a direction of conduction for an integrated circuit to be fabricated using the substrate, wherein forming the strained semiconductor layer on the substrate includes:
   orienting a semiconductor layer to the substrate; and
   bonding the oriented semiconductor layer to the substrate, wherein bonding the oriented semiconductor layer to the substrate strains the semiconductor layer, wherein:
   the semiconductor layer has a surface orientation, before the semiconductor layer is bonded to the substrate, for which a desired direction of conduction is more conductive than other directions; and
   orienting the semiconductor layer to the substrate includes:
   identifying the desired direction of conduction for the semiconductor layer before bonding the semiconductor layer to the substrate; and
   aligning the desired direction of conduction for the semiconductor layer with the direction of conduction of the substrate to orient the semiconductor layer to the substrate before bonding the oriented semiconductor layer to the substrate;
   forming a gate insulator on the strained semiconductor layer;
   forming a gate on the gate insulator; and
   forming first and second diffusion regions defining a channel beneath the gate insulator between the first and second diffusion regions,
   wherein bonding the oriented semiconductor layer to the substrate strains the oriented semiconductor layer in a desired direction of strain to promote carrier mobility in the desired direction of conduction.

49. The method of claim 48, wherein bonding the oriented semiconductor layer to the substrate to strain the semiconductor layer includes uniaxially straining the semiconductor layer in a desired direction with respect to the desired direction of conduction.

50. The method of claim 48, wherein the strain includes a tensile strain.

51. The method of claim 48, wherein the strain includes a compressive strain.

52. The method of claim 48, wherein the semiconductor layer includes a silicon layer.

53. A method for forming a CMOS device, comprising:
   forming a strained semiconductor layer on a substrate, the substrate having an n-channel direction of conduction and a p-channel direction of conduction for an integrated circuit to be fabricated using the substrate, wherein forming the strained semiconductor layer on the substrate includes:
   orienting a first semiconductor layer and a second semiconductor layer to the substrate,
   the first semiconductor layer having a first surface orientation for which a first desired direction of conduction is more conductive for electrons than other directions, wherein orienting the first semiconductor layer to the substrate includes identifying the first desired direction of conduction of the first semiconductor layer to promote electron mobility and aligning the first desired direction of conduction of the first semiconductor layer with the n-channel direction of conduction of the substrate before bonding the first semiconductor layer to the substrate,
   the second semiconductor layer having a second surface orientation for which a second desired direction of conduction is more conductive for holes than other directions, wherein orienting the second semiconductor layer to the substrate includes identifying the second desired direction of conduction of the second semiconductor layer to promote hole mobility and aligning the second desired direction of conduction of the first semiconductor layer with the p-channel direction of conduction of the substrate before bonding the second semiconductor layer to the substrate; and
   bonding the first and second oriented semiconductor layers to the substrate, wherein bonding the oriented semiconductor layers to the substrate strains the first and second semiconductor layers in desired directions of strain to promote electron and hole mobility in the first and second desired directions of conduction, respectively;
   and forming an n-channel transistor using the first semiconductor layer and forming a p-channel transistor using the second semiconductor layer.

54. The method of claim 53, wherein bonding the first and second oriented semiconductor layers to the substrate includes uniaxially straining the first and second oriented semiconductor layers in a desired direction with respect to the desired direction of conduction.

55. The method of claim 53, wherein the strain for the n-channel transistor includes a tensile strain.

56. The method of claim 53, wherein the strain for the p-channel transistor includes a compressive strain.

57. The method of claim 53, wherein the semiconductor layer includes a silicon layer.

* * * * *